(12) United States Patent
Gupta et al.

(10) Patent No.: US 9,324,490 B2
(45) Date of Patent: Apr. 26, 2016

(54) APPARATUS AND METHODS FOR VECTOR INDUCTORS

(71) Applicant: TDK Corporation, Tokyo (JP)

(72) Inventors: Dev V. Gupta, Concord, MA (US); Mehdi Si Moussa, Acton, MA (US); Zhiguo Lai, Acton, MA (US)

(73) Assignee: TDK Corporation, Tokyo (JP)

( * ) Notice: Subject to any disclaimer, the term of this patent is extended or adjusted under 35 U.S.C. 154(b) by 93 days.

(21) Appl. No.: 14/288,127

(22) Filed: May 27, 2014

(65) Prior Publication Data

US 2014/0355171 A1 Dec. 4, 2014

Related U.S. Application Data

(63) Continuation-in-part of application No. 13/955,617, filed on Jul. 31, 2013.

(60) Provisional application No. 61/857,446, filed on Jul. 23, 2013, provisional application No. 61/828,107, filed on May 28, 2013.

(51) Int. Cl.
*H01C 7/12* (2006.01)
*H01F 27/29* (2006.01)
(Continued)

(52) U.S. Cl.
CPC ............ *H01F 27/29* (2013.01); *H01F 17/0013* (2013.01); *H03H 7/0115* (2013.01);
(Continued)

(58) Field of Classification Search
USPC .......................................... 361/270, 117–120
See application file for complete search history.

(56) References Cited

U.S. PATENT DOCUMENTS

| 4,423,396 A | 12/1983 | Makimoto et al. |
| 4,456,895 A | 6/1984 | Landt et al. |

(Continued)

FOREIGN PATENT DOCUMENTS

| EP | 0 716 468 B1 | 10/2001 |
| EP | 0 780 853 B1 | 9/2002 |

(Continued)

OTHER PUBLICATIONS

PCT Search Report and Written Opinion of Jan. 20, 2015 for International Application No. PCT/US2014/039595 filed on May 27, 2014. 24 pages.

(Continued)

*Primary Examiner* — Danny Nguyen
(74) *Attorney, Agent, or Firm* — Nixon Peabody LLP

(57) ABSTRACT

Apparatus and methods for vector inductors are provided herein. In certain configurations, an apparatus includes a vector inductor comprising a plurality of conductors arranged in a stack and separated from one another by dielectric. The conductors are tightly coupled to one another to provide a relatively high amount of mutual inductance. For example, adjacent conductors in the stack can be mutually coupled with a coupling coefficient k that is at least 0.5, or more particularly, 0.9 or greater. In certain implementations, the conductors are electrically connected in parallel with one another to provide the vector inductor with low resistance. However, tight coupling between the conductors in the stack can result in vector inductor having an overall inductance that is similar to that of a self-inductance of an individual conductor in the stack. The Q-factor of the vector inductor can be increased by the inclusion of additional conductors in the stack.

26 Claims, 14 Drawing Sheets

(51) Int. Cl.
- *H01F 17/00* (2006.01)
- *H03H 7/01* (2006.01)
- *H01L 23/64* (2006.01)
- *H01F 5/00* (2006.01)
- *H03H 7/46* (2006.01)
- *H03H 7/48* (2006.01)

(52) U.S. Cl.
CPC ............ *H03H 7/175* (2013.01); *H03H 7/1758* (2013.01); *H01F 5/003* (2013.01); *H01L 23/645* (2013.01); *H03H 7/463* (2013.01); *H03H 7/48* (2013.01); *H03H 2210/025* (2013.01)

(56) References Cited

U.S. PATENT DOCUMENTS

| | | | |
|---|---|---|---|
| 4,754,242 | A | 6/1988 | Okamura et al. |
| 5,227,746 | A | 7/1993 | Esaki et al. |
| 5,530,415 | A | 6/1996 | Takaya et al. |
| 5,621,366 | A | 4/1997 | Gu |
| 6,124,624 | A | 9/2000 | Van Roosmalen et al. |
| 6,198,374 | B1 | 3/2001 | Abel |
| 6,293,001 | B1 | 9/2001 | Uriu et al. |
| 6,437,677 | B1 | 8/2002 | Takeuchi et al. |
| 6,438,000 | B1 | 8/2002 | Okamoto et al. |
| 6,472,960 | B1 | 10/2002 | Ishikawa et al. |
| 6,608,538 | B2 | 8/2003 | Wang |
| 6,664,882 | B2 | 12/2003 | Andoh et al. |
| 6,882,548 | B1 | 4/2005 | Jacobs et al. |
| 6,940,386 | B2 | 9/2005 | Mukherjee et al. |
| 7,255,801 | B2 | 8/2007 | Chen |
| 7,692,527 | B2 | 4/2010 | Ito et al. |
| 7,719,083 | B2 | 5/2010 | Chang |
| 7,728,427 | B2 | 6/2010 | Gabara |
| 8,203,419 | B2 | 6/2012 | Nazarian et al. |
| 8,289,103 | B2 | 10/2012 | Yamakawa et al. |
| 8,289,118 | B2 | 10/2012 | Chiu et al. |
| 8,324,692 | B2 | 12/2012 | Chen et al. |
| 2002/0158305 | A1 | 10/2002 | Dalmia et al. |
| 2004/0070468 | A1 | 4/2004 | Harada |
| 2004/0140528 | A1* | 7/2004 | Kim ........................ H01F 21/12 257/537 |
| 2004/0164836 | A1 | 8/2004 | Wang et al. |
| 2005/0012567 | A1 | 1/2005 | Liu |
| 2005/0030116 | A1 | 2/2005 | Takagi |
| 2005/0162234 | A1 | 7/2005 | Kobayashi et al. |
| 2005/0237131 | A1 | 10/2005 | Chang et al. |
| 2006/0077020 | A1 | 4/2006 | Wang et al. |
| 2009/0179713 | A1 | 7/2009 | Zeng et al. |
| 2009/0179722 | A1 | 7/2009 | Goyette et al. |
| 2011/0187487 | A1 | 8/2011 | Hsu et al. |
| 2011/0309994 | A1* | 12/2011 | Kato ................... H01P 1/20345 343/860 |
| 2013/0200980 | A1 | 8/2013 | Yokoyama et al. |
| 2013/0257558 | A1 | 10/2013 | Kim et al. |
| 2014/0285299 | A1 | 9/2014 | Bojer |
| 2014/0354370 | A1 | 12/2014 | Gupta et al. |
| 2015/0236014 | A1 | 8/2015 | Gathman |

FOREIGN PATENT DOCUMENTS

| | | |
|---|---|---|
| EP | 1 260 998 A1 | 11/2002 |
| EP | 2 392 382 A1 | 12/2011 |

OTHER PUBLICATIONS

Invitation to Pay Additional Fees with Communication Relating to the Results of the Partial International Search mailed Nov. 6, 2014 in International Application No. PCT/US2014/039595 in 9 pages.

Leifso et al., "A Fully Integrated Active Inductor with Independent Voltage Tunable Inductance and Series-Loss Resistance," IEEE Transaction on Microwave Theory and Techniques, vol. 49, No. 4, Apr. 2001, 7 Pages.

International Search Report and Written Opinion dated Aug. 26, 2014 for International Application No. PCT/US2014/018611, filed on Feb. 26, 2014. 20 pages.

Invitation to Pay Additional Fees with Communication Relating to the Results of the Partial International Search mailed Jun. 10, 2014 in International Application No. PCT/US2014/018611 in 6 pages.

* cited by examiner

APPARATUS AND METHODS FOR VECTOR INDUCTORS

CROSS-REFERENCE TO RELATED APPLICATIONS

This application is a continuation-in-part of commonly-owned U.S. patent application Ser. No. 13/955,617, filed Jul. 31, 2013, titled "VECTOR INDUCTOR HAVING MULTIPLE MUTUALLY COUPLED METALIZATION LAYERS PROVIDING HIGH QUALITY FACTOR", which claims the benefit of priority under 35 U.S.C. §119(e) of U.S. Provisional Patent Application No. 61/857,446, filed Jul. 23, 2013 titled "SIGNAL HANDLING APPARATUS FOR RADIO FREQUENCY CIRCUITS", and of U.S. Provisional Patent Application No. 61/828,107, filed May 28, 2013 titled "TUNABLE PASSIVE FILTER COMPONENTS", each of which is hereby incorporated by reference in their entireties herein.

BACKGROUND

1. Field

Embodiments of the invention relate to electronic systems and, in particular, to inductors for use in radio frequency (RF) electronics.

2. Description of the Related Technology

An inductance of an inductor corresponds to a ratio of a voltage across the inductor's terminals to a rate of change of current flowing through the inductor. In addition to inductance, other inductor parameters, such as quality factor (Q-factor), frequency response, and/or linearity, can also be important in selecting an inductor that is suitable for a particular application.

Inductors can be used in a variety of types of analog and radio frequency (RF) circuits. For example, inductors can be included in filters, duplexers, resonators, tuners, and/or other circuitry.

SUMMARY

In one aspect, an apparatus including a vector inductor is provided. The vector inductor includes two or more terminals comprising a first terminal and a second terminal, and a stack of conductors including three or more conductors arranged on different conductive layers. Each of the different conductive layers is separated by a dielectric. The three or more conductors include a first conductor, a second conductor, and a third conductor. The first conductor, the second conductor, and the third conductor each include a first end and a second end opposite the first end. The first end of the first conductor, the first end of the second conductor, and the first end of the third conductor are electrically connected to one another along a first side of the stack. Additionally, the second end of the first conductor, the second end of the second conductor, and the second end of the third conductor are electrically connected to one another along a second side of the stack. Furthermore, the first end of the first conductor is electrically connected to the first terminal, and the second end of the first conductor is electrically connected to the second terminal.

In another aspect, an apparatus including a vector inductor is provided. The vector inductor includes a stack of conductors comprising three or more conductors arranged on different conductive layers. Each of the different conductive layers is separated by a dielectric. The three or more conductors comprise a first conductor, a second conductor, and a third conductor. The first conductor, the second conductor, and the third conductor each comprise a conductive base, a first conductive arm extending from the conductive base, and a second conductive arm extending from the conductive base. The conductive base of the first conductor, the conductive base of the second conductor, and the conductive base of the third conductor are electrically connected to one another along a first side of the stack. Additionally, an end of the first conductive arm of the first conductor, an end of the first conductive arm of the second conductor, and an end of the first conductive arm of the third conductor are electrically connected to one another along a second side of the stack. Furthermore, an end of the second conductive arm of the first conductor, an end of the second conductive arm of the second conductor, and an end of the second conductive arm of the third conductor are electrically connected to one another along a third side of the stack.

In another aspect, an apparatus is provided. The apparatus includes a vector inductor including three or more inductive elements. The three or more inductive elements include a first inductive element arranged on a first conductive layer, a second inductive element arranged on a second conductive layer, and a third inductive element arranged on a third conductive layer. Each of the first conductive layer, the second conductive layer, and the third conductive layer are separated by one or more dielectric layers. The three or more inductive elements are electrically connected in parallel. Additionally, the three or more inductive elements are arranged such that an overall inductance of the vector inductor is not reduced by the parallel combination due to mutual coupling between the three or more inductive elements.

DETAILED DESCRIPTION OF EMBODIMENTS

Figure 1:
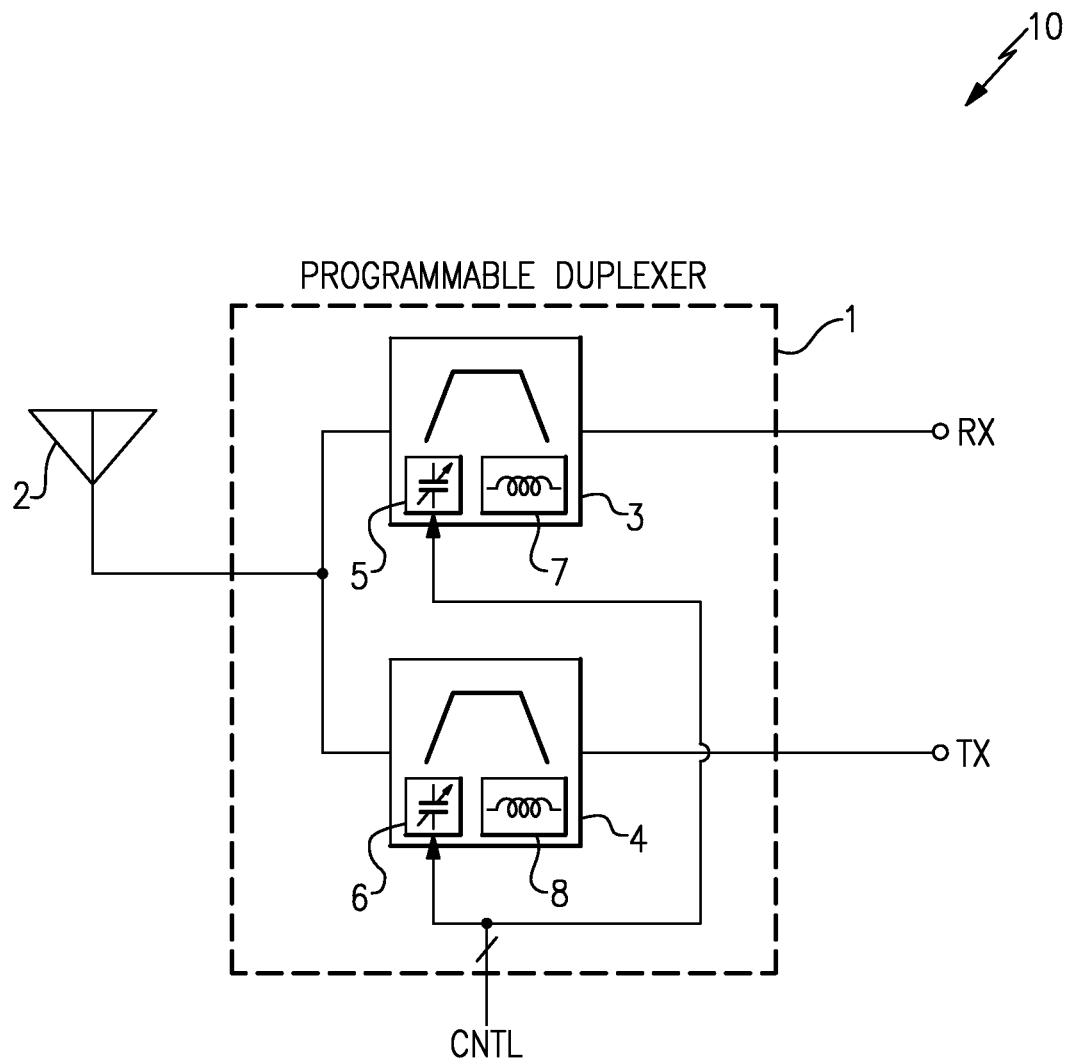
FIG. 1 is a schematic diagram of one embodiment of a radio frequency (RF) system.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

An inductor with high quality factor (Q-factor) can be desirable in a variety of applications, including, for example, certain radio frequency (RF) applications. For example, when an inductor with high Q-factor is used in a resonant inductor-capacitor (LC) circuit of a programmable filter, the programmable filter can exhibit greater frequency selectivity. Thus, the programmable filter can provide finer frequency tuning and/or enhanced rejection of out-of-band signals.

Certain conventional inductors are implemented in a coil or spiral shape. However, a path for current flow in such structures can be curved or angled. Thus, electrons associated with currents flowing through such inductors may tend to localize along the innermost edge of the coil or spiral at high frequencies, which can degrade the inductor's Q-factor.

Although increasing a size of an inductor's conductor may increase Q-factor, such an approach can undesirably increase the inductor's area. Additionally, an ability to increase Q-factor by increasing conductor size may be limited by the skin effect. As persons having ordinary skill in the art will appreciate, the skin effect is a tendency of a radio frequency signal propagating via a conductor to have a current density near the surface of the conductor, rather than through an entire thickness of the conductor.

Apparatus and methods for vector inductors are provided herein. In certain configurations, an apparatus includes a vector inductor comprising a plurality of conductors arranged in a stack and separated from one another by dielectric. The conductors are inductive coupling to one another with a relatively high amount of mutual inductance. For example, in one embodiment, adjacent conductors are mutually coupled with a coupling coefficient k that is at least 0.5, or more particularly, 0.9 or greater. In certain implementations, the conductors are electrically connected in parallel with one another to provide the vector inductor with low resistance. However, mutual coupling between the conductors in the stack can result in the vector inductor having an overall inductance that is similar to that of a self-inductance of an individual conductor in the stack. Accordingly, in certain implementations, a number of conductors in the vector inductor's stack may not affect the overall inductance of the vector inductor. However, a vector inductor with a large number of conductors in a stack can have a lower resistance and higher Q-factor relative to a vector inductor with a fewer number of conductors in the stack.

In certain embodiments, the conductors can have a substantially rectangular shape when viewed from above the vector inductor's stack. For example, the conductors can comprise elongated strips of metal. Configuring the conductors in this manner can provide a relatively straight conductive path through the conductors, which can provide high Q-factor.

In other embodiments, the conductors can have a substantially U-shape or V-shape when viewed from above the vector inductor's stack. In such configurations, the vector inductor can operate as the circuit equivalent of three inductors. For example, the vector inductor can include a first inductor associated with a self-inductance of a first conductive leg of the U-shaped or V-shaped conductor, a second inductor associated with a self-inductance of a second conductive leg of the U-shaped or V-shaped conductor, and a third inductor associated with a mutual inductance between the first and second conductive legs. While sharp angles for corners and straight lines are illustrated in the figures, those of ordinary skill in the art will appreciate that in actual embodiments, particularly with miniaturized embodiments, corners can be rounded and the "lines" can be other than straight.

The vector inductors herein can have a relatively high Q-factor, a relatively high linearity, and/or a relatively low insertion loss. Additionally, the vector inductors can have a relatively high inductance per unit area, and thus can occupy a relatively small physical space or area.

In certain configurations, a vector inductor can be integrated into a substrate, such as a printed circuit board (PCB). However, other configurations are possible, including configurations in which the vector inductor is implemented as a discrete component, such as a surface mount component (SMC).

In certain configurations, the vector inductor can be configured to operate in an inductor-capacitor (LC) resonant circuit with one or more capacitors. In certain implementations, the capacitors can be variable, and the LC resonant circuit can be used to provide frequency tuning in a wide range of RF electronics, including, for example, programmable filters, programmable resonators, programmable antenna tuners, programmable impedance matching networks, programmable phase shifters, and/or programmable duplexers.

FIG. 1 is a schematic diagram of one embodiment of a radio frequency (RF) system 10. The RF system 10 includes a programmable duplexer 1, an antenna 2, a receive terminal RX, and a transmit terminal TX. The RF system 10 can represent a portion of a wireless device, such as a smart phone. Accordingly, although not illustrated in FIG. 1 for clarity, the RF system 10 can include additional components and/or circuitry.

As shown in FIG. 1, the programmable duplexer 1 includes a first programmable filter 3 and a second programmable filter 4. The first programmable filter 3 includes an input electrically connected to the antenna 2 and an output electrically connected to the receive terminal RX. The first programmable filter 3 further includes a first variable capacitor structure 5, which can be used to control a filtering characteristic of the first programmable filter 3, such as the location in frequency of a passband. The second programmable filter 4 includes an input electrically connected to the transmit terminal TX and an output electrically connected to the antenna 2. The second programmable filter 4 further includes a second variable capacitor structure 6, which can be used to control a filtering characteristic of the second programmable filter 4.

A wireless device such as a smart phone, tablet, or laptop computer can communicate over multiple frequency bands using one or more common or shared antennas. A desire to transmit at wider bandwidth and/or over different communications networks has increased a demand for the number of bands that a wireless device can communicate over. For example, a wireless device may be specified to operate using one or more of a variety of communications standards including, for example, GSM/EDGE, IMT-2000 (3G), 4G, Long Term Evolution (LTE), Advanced LTE, IEEE 802.11 (Wi-Fi), Mobile WiMAX, Near Field Communication (NFC), Global Positioning System (GPS), GLONASS, Galileo, Bluetooth, and the like. Proprietary standards can also be applicable. The complexities of multi-band communication can be further exacerbated in configurations in which the wireless device is specified to use carrier aggregation.

Certain conventional wireless devices can include a multi-throw switch and a duplexer associated with each of the frequency bands, and the multi-throw switch can be used to selectively couple an antenna to a duplexer associated with a particular band. The duplexers can provide band filtering using, for example, passive filtering structures, such as a surface acoustic wave (SAW) filters and/or thin film bulk acoustic resonators (FBARs). The multi-throw switch can be used to electrically couple the antenna to a duplexer associated with a frequency band that the wireless device is transmitting and/or receiving over at a particular time instance.

In the illustrated configuration, the programmable duplexer 1 can be configured to filter a particular frequency band by programming the first and second programmable filters 3, 4 using a control signal CNTL. For example, in certain embodiments, the capacitance value of the first variable capacitor structure 5 can be controlled using the control signal CNTL to control a frequency location of a passband of the first programmable filter 3, and the capacitance value of the second variable capacitor structure 6 can be controlled using the control signal CNTL to control a frequency location of a passband of the second programmable filter 4.

Accordingly, the programmable duplexer 1 can be used to provide the RF system 10 with multi-band capability, while avoiding a need for using a multi-throw switch and a duplexer for each frequency band. Including the programmable duplexer 1 in the RF system 10 can reduce insertion loss in transmit and/or receive paths by eliminating a need for a multi-throw switch. Furthermore, the programmable duplexer 1 can have smaller area relative to a configuration including a multi-throw switch and multiple duplexers. Thus, a wireless device that includes the programmable duplexer 1 can have a smaller form factor and/or lower cost.

In the illustrated configuration, the capacitance values of the first and second variable capacitor structures 5, 6 can be controlled using the control signal CNTL. In one embodiment, the control signal CNTL is received by the programmable duplexer 1 over an interface, such as a serial peripheral interface (SPI) or Mobile Industry Processor Interface radio frequency front end (MIPI RFFE) interface. Although two examples of interfaces have been provided, other interfaces can be used. Although FIG. 1 illustrates the first and second variable capacitor structures 5, 6 as receiving a common control signal CNTL, other configurations are possible, such as implementations in which the first and second variable capacitor structures 5, 6 are controlled using separate control signals. In certain configurations, the first variable capacitor structure 5 and/or the second variable capacitor structure 6 are implemented using one or more ICs that include variable capacitor arrays.

In one embodiment, the first and second inductor structures 7, 8 are implemented using vector inductors, which can provide higher Q-factor and/or smaller area relative to certain other inductive structures, such as spiral or coil inductors.

Although the RF system 10 illustrates one example of a system that can include one or more vector inductors, the vector inductors described herein can be used in other systems.

Figure 2:
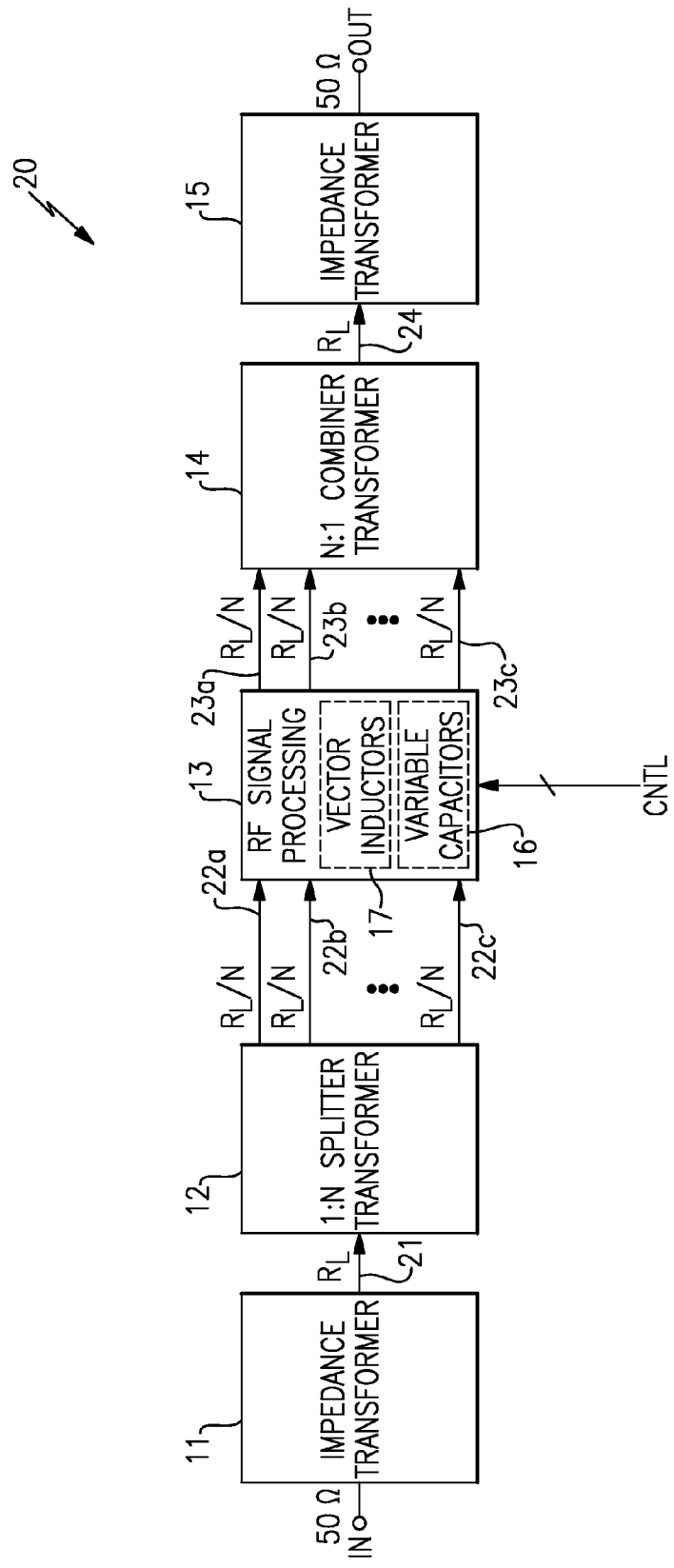
FIG. 2 is a schematic diagram of a programmable filter according to one embodiment.

FIG. 2 is a schematic diagram of a programmable filter 20 according to one embodiment. The programmable filter 20 includes an input impedance transformer 11, a splitter transformer 12, an RF signal processing circuit 13, a combiner transformer 14, and an output impedance transformer 15. The programmable filter 20 further includes an RF input IN and an RF output OUT.

The programmable filter 20 illustrates one embodiment of a programmable filter suitable for implementing the first and/or second programmable filters 3, 4 shown in FIG. 1. However, the programmable filter 20 can be used in other systems and/or the first and/or second programmable filters 3, 4 can be implemented in other ways.

The input impedance transformer 11 can receive an RF input signal on the RF input IN, and can generate an impedance transformed signal 21. The input impedance transformer 11 can provide an impedance transformation from input to output. For example, in one embodiment, the input impedance transformer 11 transforms an input impedance of about 50Ω to an output impedance of about $R_L$, where $R_L$ is less than 50Ω, for example, 8Ω.

Transforming the input impedance of the programmable filter 20 in this manner can result in the impedance transformed signal 21 having a smaller voltage level relative to a voltage level of the RF input signal received at the RF input IN. For example, when the programmable filter 20 has an input impedance of about 50Ω, the voltage level of the impedance transformed signal 21 can be smaller than the voltage level of the RF input signal by a factor of about $\sqrt{50/R_L}$.

The splitter transformer 12 can receive the impedance transformed signal 21 from the input impedance transformer 11, and can generate N split signals, where N is an integer greater than or equal to 2. In the illustrated configuration, the splitter transformer 12 generates a first split signal 22a, a second split signal 22b, and a third split signal 22c. Although an example with N=3 has been illustrated, the principles and advantages disclosed herein are applicable to a broad range of values for the integer N, including 2, 3, 4, 5, or 6 or more.

Splitting the impedance transformed signal 21 into N split signals can further decrease a voltage level of the RF input signal by a factor of N. Including the splitter transformer 12 can also reduce the impedance by a factor of N. For example, when the output impedance of the input impedance transformer 11 has a value of $R_L$, the output impedance of each output of the splitter transformer 12 can have a value of $R_L/N$.

As shown in FIG. 2, the RF signal processing circuit 13 can receive the first, second, and third split signals 22a-22c, and can generate first, second, and third processed RF signals 23a-23c, respectively. As illustrated in FIG. 2, the RF signal processing circuit 13 includes variable capacitors 16, which can capacitances that can be controlled using a control signal CNTL. The RF signal processing circuit 13 further includes vector inductors 17. The vector inductors 17 and the variable capacitors 16 can determine a filtering characteristic of the RF signal processing circuit 13.

The illustrated RF signal processing circuit 13 can be used to process the split signals 22a-22c generated by the splitter transformer 12 to generate the processed signals 23a-23c, respectively. In certain configurations, the RF signal processing circuit 13 can include substantially identical circuitry in the signal paths between the RF signal processing circuit's inputs and outputs.

The combiner transformer 14 receives the processed signals 23a-23c, which the combiner transformer 14 can combine to generate a combined signal 24. The combiner transformer 14 can also provide an impedance transformation. For example, in a configuration in which each output of the RF signal processing circuit 13 has an output impedance of about $R_L/N$, the combiner transformer 14 can have an output impedance of about $R_L$.

The output impedance transformer 15 receives the combined signal 24 from the combiner transformer 14, and generates the RF output signal on the RF output OUT. In certain configurations, the combiner transformer 14 can have an output impedance $R_L$ that is less than 50Ω, and the output impedance transformer 15 can be used to provide the RF output signal at an output impedance of about 50 Ω.

The illustrated programmable filter 20 provides filtering using the RF signal processing circuit 13, which processes the split signals 22a-22c at lower impedance relative to the programmable filter's input impedance. Thereafter, the processed signals 23a-23c are combined and transformed up in impedance. For example, in one embodiment, the programmable filter's output impedance is about equal to the programmable filter's input impedance.

Configuring the programmable filter 20 to process an RF input signal in this manner can increase the programmable filter's voltage handling capability. For example, when the programmable filter 20 has an input impedance of about 50Ω, the voltage level of the RF input signal can be decreased by a factor of about $N\sqrt{50/R_L}$ before it is provided to the RF signal processing circuit 13, which may include circuitry that is sensitive to high voltage conditions. Accordingly, the illustrated programmable filter 20 can be used to process high voltage RF input signals and/or can have enhanced robustness to variations in voltage standing wave ratio (VWSR).

Furthermore, configuring the programmable filter 20 to process the RF signal at lower impedance can enhance the programmable filter's linearity. In one embodiment, the illustrated configuration can reduce the third order intermodulation distortion (IMD3) by a factor of about $40 \log_{10} N\sqrt{50/R_L}$ relative to a configuration in which an RF input signal is provided directly to an RF signal processing circuit without impedance transformation or splitting. In one illustrative example, N can be selected to be equal to 8 and $R_L$ can be selected to be about equal to about 8Ω, and the programmable filter can provide a linearity improvement of about 52 dB. However, other configurations are possible.

Figure 3A:
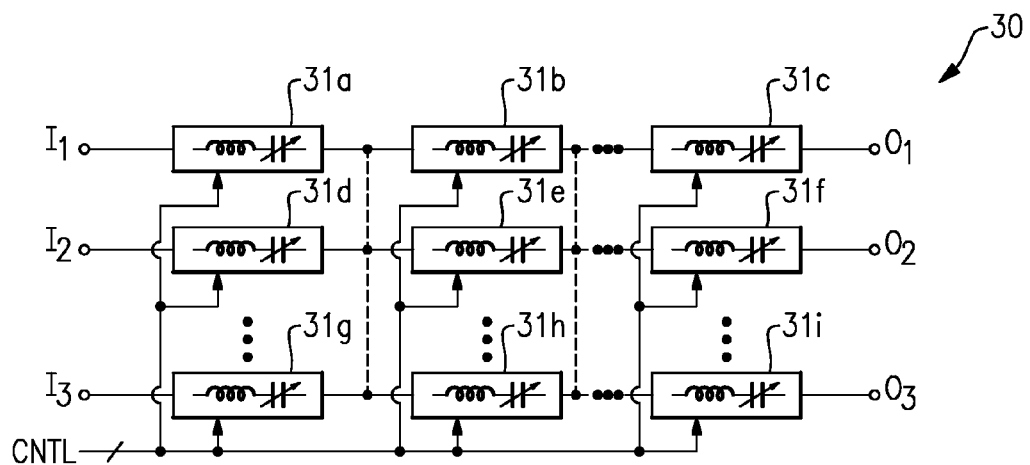
FIG. 3A is a schematic diagram of one embodiment of an RF signal processing circuit.

FIG. 3A is a schematic diagram of one embodiment of an RF signal processing circuit 30. The RF signal processing circuit 30 includes a first inductor-capacitor (LC) circuit 31a, a second LC circuit 31b, a third LC circuit 31c, a fourth LC circuit 31d, a fifth LC circuit 31e, a sixth LC circuit 31f, a seventh LC circuit 31g, an eighth LC circuit 31h, and a ninth LC circuit 31i. The RF signal processing circuit 30 illustrates one embodiment of the RF signal processing circuit 13 of FIG. 2.

As shown in FIG. 3A, the first, second, and third LC circuits 31a-31c are arranged in a cascade between a first RF input $I_1$ and a first RF output $O_1$. Additionally, the fourth, fifth, and sixth LC circuits 31d-31f are arranged in a cascade between a second RF input $I_2$ and a second RF output $O_2$. Furthermore, the seventh, eighth, and ninth LC circuits 31g-31i are arranged in a cascade between a third RF input $I_3$ and a third RF output $O_3$.

Although FIG. 3A illustrates a configuration including three RF inputs and three RF outputs, the RF signal processing circuit 30 can be adapted to include more or fewer inputs and outputs.

The RF signal processing circuit 30 can be used to process RF input signals received on the first to third RF inputs $I_1$-$I_3$ to generate RF output signals on the first to third RF outputs $O_1$-$O_3$. As shown in FIG. 3A, the RF signal processing circuit 30 receives a control signal CNTL, which can be used to control a variable capacitance associated with the first to ninth LC circuits 31a-31i. By controlling the LC circuits' capacitances, the control signal CNTL can be used to tune a frequency response of the RF signal processing circuit 30.

In one embodiment, the RF signal processing circuit 30 is configured to operate as a band pass filter, and the control signal CNTL can be used to control a location in frequency of the band pass filter's passband. However, other configurations are possible.

Although FIG. 3A illustrates a configuration including three LC circuits arranged in a cascade between each input and output, more or fewer LC circuits and/or other processing circuitry can be included.

Cascading LC circuits can increase a voltage handling capability of an RF signal processing circuit by limiting a voltage drop across individual circuit components of the LC circuits. For example, in certain implementations, the LC circuits 31a-31i are implemented using MOS capacitors, which can be damaged by large gate-to-drain and/or gate-to-source voltages. By arranging two or more LC circuits in a cascade, a voltage drop across the MOS capacitors during operation can be increased relative to a configuration including a single LC circuit between a particular input and output.

The RF signal processing circuit 30 illustrates one embodiment of the RF signal processing circuit 13 of FIG. 2. For example, in certain configurations, the first to third input RF inputs $I_1$-$I_3$ can receive the first to third RF split signals 22a-22c, respectively, and the first to third RF outputs $O_1$-$O_3$ can generate the first to third processed signals 23a-23c, respectively.

The RF signal processing circuit 30 includes a first signal path between the first RF input $I_1$ and the first RF output $O_1$, a second signal path between the second RF input $I_2$ and the second RF output $O_2$, and a third signal path between the third RF input $I_3$ and the third RF output $O_3$. In certain configurations, one or more electrical connections can be provided between corresponding positions along the first to third signals paths. For example, in certain implementations, the RF signal processing circuit 30 is used to process substantially identical RF input signals received on the first to third RF inputs $I_1$-$I_3$, respectively, to generate substantially identical RF output signals on the first to third RF outputs $O_1$-$O_3$. In such configurations, electrical connections can be provided along corresponding positions of signal paths, since the corresponding positions should have substantially the same voltage level. Examples of such electrical connections are illustrated in FIG. 3A with dashed lines.

In certain configurations, all or part of the inductors of an RF signal processing circuit are implemented using vector inductors. For example, all or part of the inductors used in the first to ninth LC circuits 31a-31i can be implemented using vector inductors.

Figure 3B:
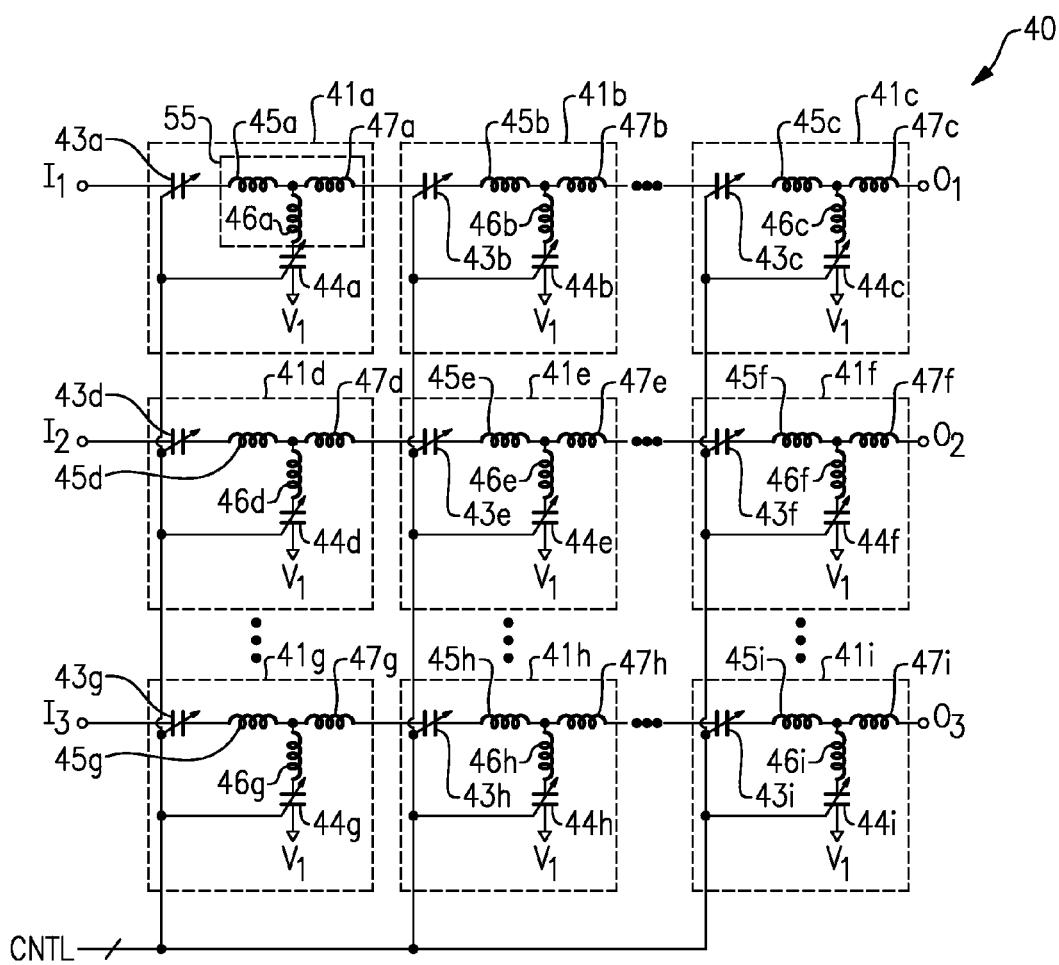
FIG. 3B is a schematic diagram of another embodiment of an RF signal processing circuit.

FIG. 3B is a schematic diagram of another embodiment of an RF signal processing circuit 40. The RF signal processing circuit 40 includes a first LC circuit 41a, a second LC circuit 41b, a third LC circuit 41c, a fourth LC circuit 41d, a fifth LC circuit 41e, a sixth LC circuit 41f, a seventh LC circuit 41g, an eighth LC circuit 41h, and a ninth LC circuit 41i.

The first to ninth LC circuits 41a-41i each include an input and an output. The first, second, and third LC circuits 41a-41c are arranged in a cascade between the first RF input I₁ and the first RF output O₁. Additionally, the fourth, fifth, and sixth LC circuits 41d-41f are arranged in a cascade between the second RF input I₂ and second RF output O₂. Furthermore, the seventh, eighth, and ninth LC circuits are arranged in a cascade between the third RF input I₃ and the third RF output O₃.

The first LC circuit 41a includes a first variable capacitor 43a, a second variable capacitor 44a, a first inductor 45a, a second inductor 46a, and a third inductor 47a. The first variable capacitor 43a includes a first end electrically connected to the input of the first LC circuit 41a, and a second end electrically connected to a first end of the first inductor 45a. The first inductor 45a further includes a second end electrically connected to a first end of the second inductor 46a and to a first end of the third inductor 47a. The second variable capacitor 44a includes a first end electrically connected to a second end of the second inductor 46a and a second end electrically connected to a first voltage V₁, which can be, for example, a ground or power low supply. The third inductor 47a further includes a second end electrically connected to an output of the first LC circuit 41a.

The second to ninth LC circuits 41b-41i include first variable capacitors 43b-43i, second variable capacitors 44b-44i, first inductors 45b-45i, second inductors 46b-46i, and third inductors 47b-47i, respectively. Additional details of the second to ninth LC circuits 41b-41i can be similar to those described above with respect to the first LC circuit 41a.

The control signal CNTL can be used to control variable capacitances of the variable capacitors of the first to ninth LC circuits 41a-41i, thereby controlling a passband of the RF signal processing circuit 40. In certain implementations, an inductance of the first to ninth LC circuits 41a-41i is substantially fixed or constant.

In certain configurations, all or part of the inductors of an RF signal processing circuit are implemented using vector inductors. For example, as shown in FIG. 3B, in one embodiment, the first inductor 45a, the second inductor 46a, and the third inductor 47a are implemented as a vector inductor 55. For example, the vector inductor 55 can be implemented as a U-shaped or V-shaped vector inductor, which can provide the equivalent circuit functionality of three inductors.

Figure 4A:
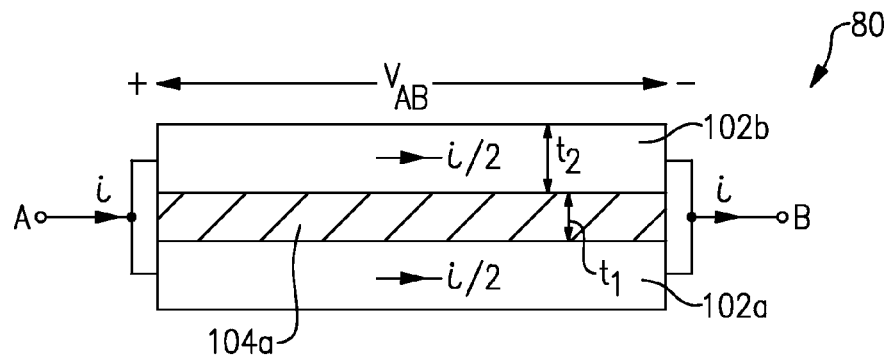
FIG. 4A is a cross section of a portion of a vector inductor according to one embodiment.

FIG. 4A is a cross section of a portion of a vector inductor according to one embodiment. The portion of the vector inductor or inductive structure 80 includes a first conductor 102a and a second conductor 102b, which are separated by a first dielectric region 104a.

As shown in FIG. 4A, a first terminal A is electrically connected to a first end of the first conductor 102a and to a first end of the second conductor 102b. Additionally, a second terminal B is electrically connected to a second end of the first conductor 102a and to a second end of the second conductor 102b.

The inductive structure 80 has been annotated to include a voltage V_{AB} between the first terminal A and the second terminal B and to illustrate a current i flowing therethrough. As shown in FIG. 4A, a first current having a magnitude about equal to i/2 can flow through the first conductor 102a, and a second current having a magnitude about equal to i/2 can flow through the second conductor 102b.

In certain configurations, the voltage V_{AB} across the inductive structure 80 can be given by Equation 1 below, where L is equal to the self-inductance of the first conductor 102a and of the second conductor 102b, and M is equal to the mutual inductance between the first and second conductors 102a, 102b.

$$V_{AB} = L\frac{d\frac{i}{2}}{dt} + M\frac{d\frac{i}{2}}{dt} = \left(\frac{L}{2} + \frac{M}{2}\right)\frac{di}{dt} \quad \text{Equation 1}$$

The mutual inductance M between a first inductor of self-inductance L₁ and a second inductor of self-inductance L₂ can be about equal to $k\sqrt{L_1 * L_2}$, where k is the coupling coefficient between the inductors. In the illustrated configuration, the first and second conductors 102a, 102b have about equal self-inductance L, and thus the mutual inductance M can be about equal to k*L, where k is equal to the coupling coefficient between the first and second conductors 102a, 102b. Accordingly, in certain implementations, the voltage V_{AB} across the inductive structure 80 can be given by Equation 2 below.

$$V_{AB} = \left(\frac{L}{2} + \frac{kL}{2}\right)\frac{di}{dt} \approx L\frac{di}{dt} \text{ for } k \approx 1 \quad \text{Equation 2}$$

Accordingly, a pair of conductors each having a self-inductance L, can have an overall inductance that is also about equal to L when the conductors are tightly coupled, such as when the conductors are mutually coupled with a relatively high coupling coefficient, for example, a coupling coefficient of at least 0.9.

In certain implementations, the dielectric regions between adjacent conductors can be relatively thin, such that adjacent conductors exhibit a high degree of mutual coupling. In one embodiment, a thickness t₁ of the first dielectric region 104a is selected to be in the range of about 8 μm to about 50 μm. In certain configurations, the dielectric regions between conductors have a thickness that is less a thickness of the conductors. For example, in one embodiment, the conductors have a thickness t₂ that is in the range of about 16 μm to about 32 μm. Although examples of specific thicknesses of conductors and dielectric regions have been provided, other configurations are possible.

Although an overall inductance of the pair of conductors can be about equal to a self-inductance of an individual one of the conductors, the resistance of the inductive structure 80 can be smaller than a resistance of an individual conductor. For example, when the first and second conductors 102a, 102b each have a resistance R, an overall resistance between the first terminal A and the second terminal B can be about equal to R/2.

When additional conductors are added to the stack, resistance can further decrease. However, the overall inductance can remain about equal to L when the conductors are tightly coupled to one another via mutual induction.

Figure 4B:
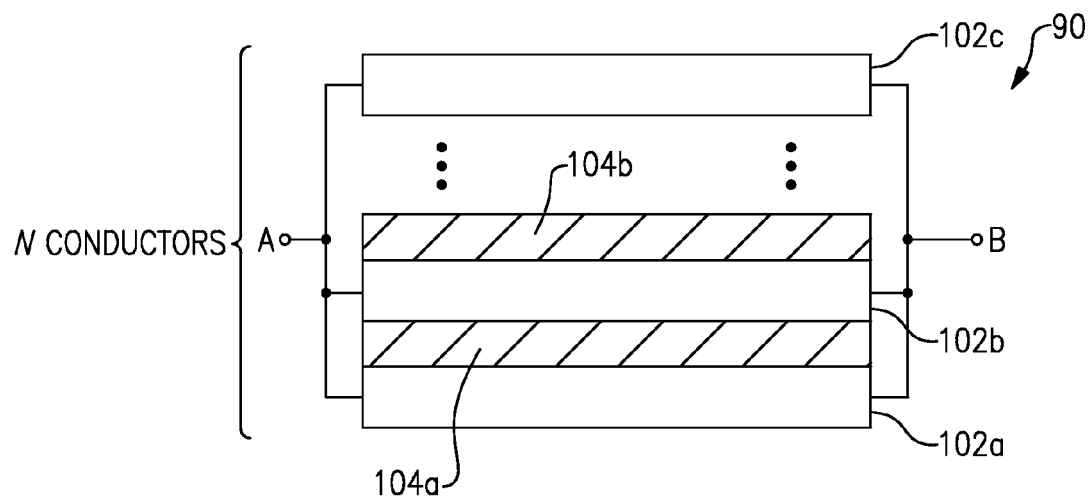
FIG. 4B is a cross section of a vector inductor according to one embodiment.

FIG. 4B is a cross section of a vector inductor 90 according to one embodiment. The vector inductor 90 is illustrated as including a first conductor 102a, a second conductor 102b, and a third conductor 102c, with the first and second conductors 102a, 102b separated by a first dielectric region 104a and with the second and third conductors 102b, 102c separated by a second dielectric region 104b. However, as indicated by the ellipses, the vector inductor 90 can include N conductors. N can vary in a very broad range.

In one embodiment, a vector inductor includes a stack of N conductors, where N is selected to be in the range of about 4 conductors and about 16 conductors. As used herein, a first conductor in a stack of N conductors can be referred to as a lowermost conductor in the stack, while the last or Nth conductor in the stack can be referred to as an uppermost conductor in the stack.

As shown in FIG. 4B, the conductors 102a-102c can be arranged vertically in a stack. Additionally, adjacent conductors in the stack can be tightly coupled to one another via inductive coupling to achieve a high amount of mutual inductance. In one embodiment, adjacent conductors in a vector inductor's stack are configured to have a coupling coefficient k that is at least 0.5, or more particularly, 0.9 or greater.

Tightly coupling the conductors via inductive coupling can result in the vector inductor 90 having an overall inductance that is similar to a self-inductance of an individual conductor in the stack. However, the conductors can be electrically connected in parallel, and thus an Ohmic loss of the vector inductor 90 can decrease with an increase in the number of conductors in the stack. Accordingly, the Q-factor of a vector inductor can be increased by including additional conductors in the stack.

Moreover, a configuration including multiple conductors arranged in a stack can also provide higher conductivity for radio frequency (RF) signals relative to a configuration including a single solid conductor of similar dimension. For example, implementing the conductors in a stack can provide a greater amount of conductor surface area relative to a single solid conductor, and thus the vector inductor can provide high conductivity in the presence of skin effect.

The vector inductor 90 can also be implemented in a relatively small area relative to certain inductors of similar inductance and/or resistivity. For example, in one embodiment, the vector inductor 90 includes N conductors of self-inductance L. When the conductors of the vector inductor 90 are tightly coupled, an overall inductance of the vector inductor 90 can be about equal to L. In contrast, an inductor that operates without mutual coupling can have an overall size that is a factor of about N times greater to achieve a similar inductance. Furthermore, since the conductors are arranged in a vertical stack, the conductors can occupy an area that is about a factor of 1/N smaller relative to a planar configuration. The net result of mutual coupling and vertical integration can result in a reduction of size by a factor of about $N^2$ relative to an inductor that is implemented without layering and without mutual coupling.

In certain configurations, the vector inductor 90 can be configured to have high mutual inductance between adjacent conductors in part by using a dielectric material between the conductors that has a relatively high permittivity. As persons having ordinary skill in the art will appreciate, relative permittivity $\in_r$ can correspond to a ratio of the permittivity of a specific medium relative to the permittivity of free space $\in_0$. In one embodiment, the dielectric is implemented using a dielectric material having a relative permittivity $\in_r$ that is in the range of about 2.7 to about 10. However, other configurations are possible.

The dielectric regions of the vector inductor 90 can include any suitable dielectric material. In certain configurations, one or more of the vector inductor's dielectric regions can include an adhesive, such as epoxy. For example, in certain configurations, the vector inductor 90 is constructed of two or more subassemblies that are attached to one another using adhesive. In one embodiment, the dielectric regions comprise FR-4 board. In another embodiment, the conductors are mechanically suspended from one another, and the dielectric can include air. In certain embodiments, the dielectric is a solid.

The conductors of the vector inductor 90 can include any suitable conductive material. In one embodiment, the conductors comprise at least one of copper or silver.

In certain configurations, the dielectric regions disposed between adjacent conductors can have low dielectric loss. For example, in one embodiment, the dielectric loss tangent (tan δ) of the dielectric regions can be selected to be much less than 1, for instance, 0.00002 or less. As persons having ordinary skill in the art will appreciate, an electromagnetic field in a dielectric can include a reactive or lossless component and a resistive or lossy component, and a dielectric with low dielectric loss tangent can have a reactive component that is much greater in magnitude than the resistive component.

A dielectric with low dielectric loss tangent can also be associated with a relatively small amount of heat dissipation. Thus, selecting a dielectric with low dielectric loss tangent can aid in integrating a vector inductor in applications having stringent heat dissipation specifications, such as in certain wireless device applications.

In certain configurations, a thickness of the vector inductor's dielectric regions is substantially the same. Additionally, in certain configurations, a thickness of the vector inductor's conductors is substantially the same. However, other configurations are possible, including, for example, configurations in which the thicknesses of dielectric regions are different and/or configurations in which the thicknesses of conductors are different.

In certain configurations, the vector inductor's conductors can be implemented as individual strips or patches of conductive material, such as elongated strips of metal. For example, the vector inductor's conductors can be implemented to have a substantially rectangular shape when from viewed from above the conductor stack. Configuring the conductors in a substantially rectangular shape can reduce or eliminate curves and angles to provide a relatively straight path for electron flow, which in turn can provide high Q-factor. However, as will be described in detail below, other configuration are possible, including, for example, configurations in which the vector inductor's conductors are substantially U-shaped or V-shaped when viewed from above the stack.

Figure 5A:
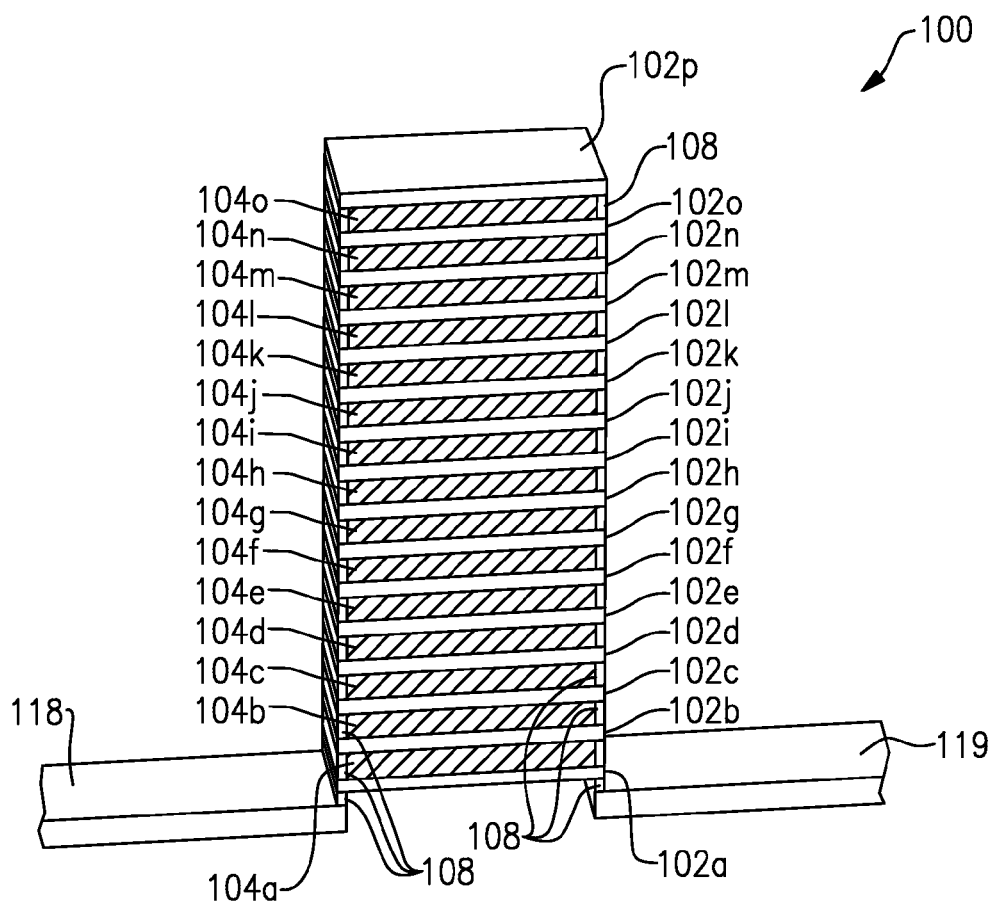
FIG. 5A is a perspective view of a vector inductor according to one embodiment.

FIG. 5A is a perspective view of a vector inductor 100 according to one embodiment. The vector inductor 100 includes first to sixteenth conductors 102a-102p, respectively. The vector inductor 100 further includes first to fifteenth dielectric regions 104a-104o, respectively. The vector inductor 100 further includes conductive sidewalls 108, a first terminal 118, and a second terminal 119.

Although the vector inductor 100 is illustrated as including sixteen conductors, the teachings herein are applicable to vector inductors including more or fewer conductors.

In one embodiment, the vector inductor 100 is implemented as a discrete component. For example, in certain configurations the vector inductor 100 comprises a discrete component that can be attached to a surface of a substrate using surface mount technology (SMT).

In another embodiment, the vector inductor 100 is implemented within a printed circuit board (PCB). In such a configuration, the first to sixteenth conductors 102a-102p can correspond to conductive layers of the PCB.

Figure 5B:
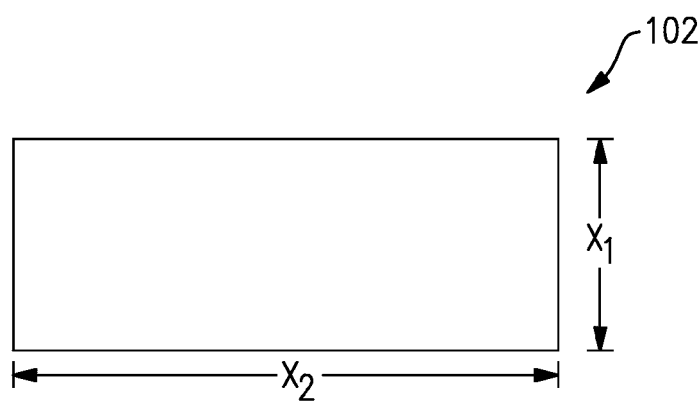
FIG. 5B is a plan view of a conductor of the vector inductor of FIG. 5A.

FIG. 5B is a plan view of a conductor 102 of the vector inductor 100 of FIG. 5A. The conductor 102 can correspond to an overhead view of any of the conductors 102a-102p of FIG. 5A.

As shown in FIG. 5B, the conductor 102 has a substantially rectangular shape when viewed from above the vector inductor's stack. Configuring the conductor 102 in this manner can enhance conductivity at high frequencies by providing a relatively straight path for current flow, which in turn can increase Q-factor.

In one embodiment, the conductor 102 has a height $X_1$ in the range of about 250 μm to about 2,000 μm, and a width $X_2$ in the range of about 2,500 μm to about 10,000 μm. However, other configurations are possible.

Figure 6:
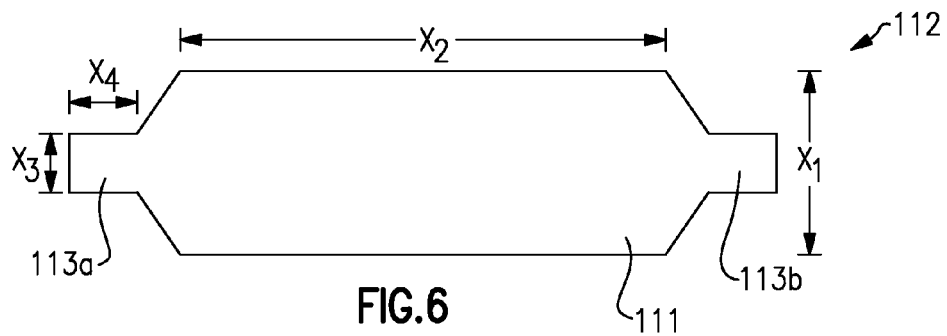
FIG. 6 is a plan view of a conductor of a vector inductor according to another embodiment.

FIG. 6 is a plan view of a conductor 112 of a vector inductor according to another embodiment.

The conductor 112 of FIG. 6 is similar to the conductor 102 of FIG. 5B, except that the conductor 112 of FIG. 6 further includes a first stub 113a and a second stub 113b, which are located on opposite ends of a conductive body 111.

The first and second stubs 113a, 113b can aid in providing impedance matching to components and/or other circuitry that is electrically connected to a vector inductor.

As shown in FIG. 6, the conductor 112 includes the conductive body 111, which can have a height $X_1$ and a width $X_2$ similar to that of conductor 112 of FIG. 5B. Additionally, the conductor 112 can have a stub height $X_3$ and a stub width $X_4$. In one embodiment, the stub height $X_3$ is in the range of about 100 μm to about 1,000 μm, and the stub width $X_4$ is in the range of 100 μm to about 1,000 μm. However, other configurations are possible.

Figure 7A:
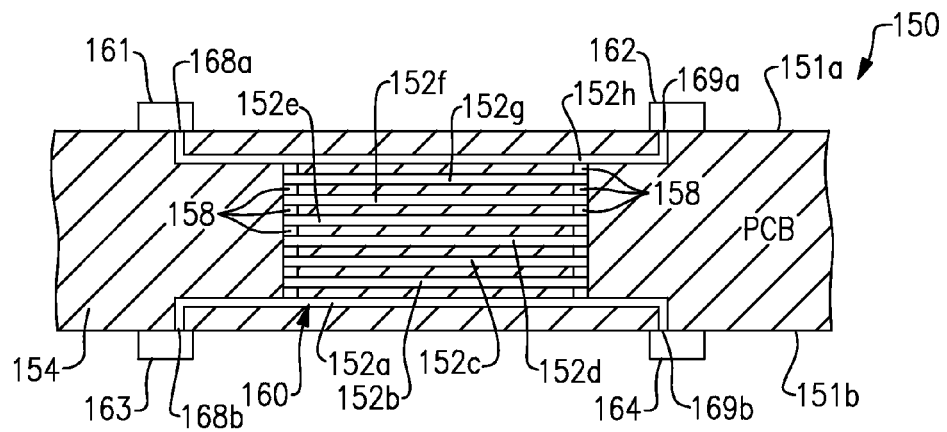
FIG. 7A is a cross section of a printed circuit board (PCB) according to one embodiment.

FIG. 7A is a cross section of a printed circuit board (PCB) 150 according to one embodiment. The PCB 150 includes dielectric 154 and first to eighth conductors 152a-152h, which have been implemented as a vector inductor 160. As shown in FIG. 7A, the PCB 150 further includes vias 158, which operate as conductive sidewalls of the vector inductor 160 to electrically connect adjacent conductors to one another along the ends of the conductors.

Although the PCB 150 illustrates a vector inductor that includes eight conductors in the vector inductor's conductor stack, the teachings herein are applicable to configurations including more or fewer conductors in a stack.

The illustrated PCB 150 includes a top surface 151a, which includes a first top surface inductor terminal 168a and a second top surface inductor terminal 169a. Additionally, the illustrated PCB 150 includes a bottom surface 151b, which includes a first bottom surface inductor terminal 168b and a second bottom surface inductor terminal 169b.

In the illustrated configuration, a first component 161 has been electrically connected to the first top surface inductor terminal 168a, a second component 162 has been electrically connected to the second top surface inductor terminal 169a, a third component 163 has been electrically connected to the first bottom surface inductor terminal 168b, and a fourth component 164 has been electrically connected to the second bottom surface inductor terminal 169b.

The first to fourth components 161-164 can be implemented in a variety of ways, including, for example, as surface mount components (SMCs), integrated circuits (ICs), or a combination thereof. Furthermore, all or part of the first to fourth components 161-164 can be omitted in favor of connecting the vector inductor 160 in other ways. In one embodiment, the first to fourth components 161-164 comprise surface mount capacitors, and the vector inductor 160 and the surface mount capacitors operate in a LC resonant circuit. In another embodiment, the first to fourth components 161-164 comprise ICs including one or more variable capacitors that have a controllable capacitance.

Accordingly, the illustrated PCB 150 includes a vector inductor that can be electrically connected to other circuitry on the top and/or bottom surfaces of the PCB 150.

Configuring the PCB 150 in this manner can facilitate providing electrical connections between the vector inductor 160 and other components or circuitry. For example, integrated circuits (ICs) and/or surface mount components can be attached to the PCB's top and bottom surfaces, and can be electrically connected to the vector inductor 160 using traces or other electrical connections.

Additionally, providing both top and bottom terminals for a vector inductor can reduce an electrical length between the vector inductor's terminals and an innermost conductor in the vector inductor's stack.

In one embodiment, the PCB comprises alternating layers of conductor, such as copper, and a dielectric, such as FR-4 board. In another embodiment, the PCB comprises a low temperature co-fired ceramic (LTCC) multi-layer PCB including alternating layers of conductor, such as copper and/or silver, and a ceramic dielectric, such as alumina.

Figure 7B:
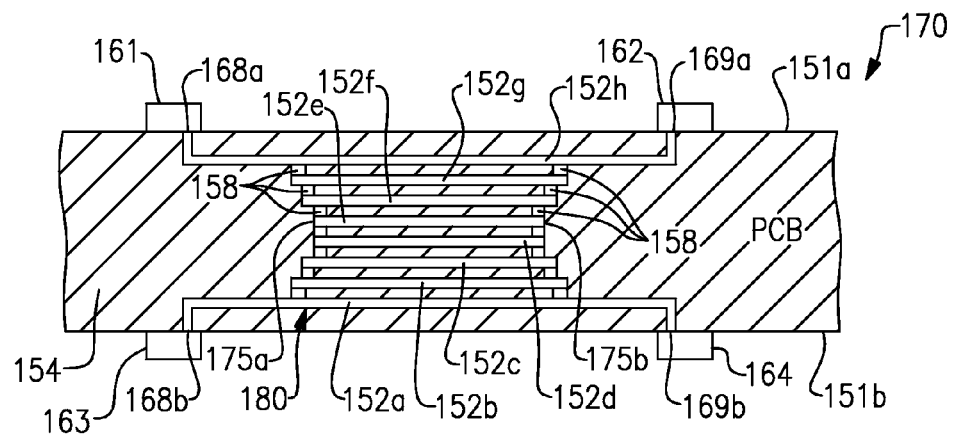
FIG. 7B is a cross section of a PCB according to another embodiment.

FIG. 7B is a cross section of a PCB 170 according to another embodiment.

The PCB 170 of FIG. 7B is similar to the PCB 150 of FIG. 7A, except that the PCB 170 includes a vector inductor 180 that includes a conductor stack with tapered sides 175a, 175b. In particular, rather than including a stack of conductors of substantially the same width, the illustrated configuration includes a stack of conductors that are tapered in width with the uppermost and bottommost conductors having a longer width relative to conductors in the middle of the stack.

Configuring the conductors 152a-152h in this manner can help balance differences in mutual coupling between conductors in the stack and/or to balance a flow of current through the conductors relative to one another. For example, when the conductors are not tapered, the innermost conductor of the stack may have a larger amount of mutual coupling relative to the stack's outermost conductors, and thus the innermost conductor may have a larger overall inductance and smaller current flow relative to the outermost conductors. Thus, the conductors in the stack can be tapered to compensate for differences in mutual coupling between conductors to provide substantially the same amount of current flow in each of the conductors in the vector inductor's stack. In certain embodiments, tapering is also used to compensate for differences in electrical length between the vector inductor's terminals and a particular conductor in the stack.

Accordingly, the illustrated configuration includes conductors that are tapered to balance a flow of current through the conductors relative to one another.

Figure 8A:
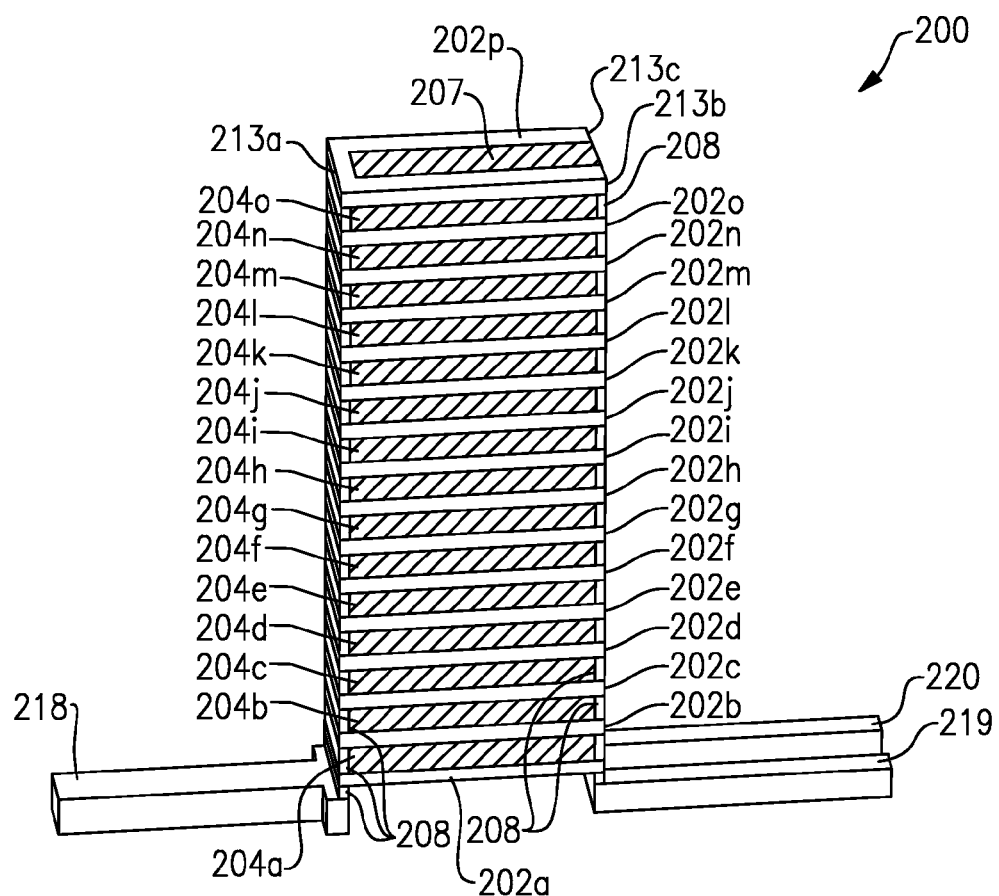
FIG. 8A is a perspective view of a vector inductor according to another embodiment.

FIG. 8A is a perspective view of a vector inductor 200 according to another embodiment. The vector inductor 200 includes first to sixteenth conductors 202a-202p, respectively. The vector inductor 200 further includes first to fifteenth dielectric regions 204a-204o, respectively. The vector inductor 200 further includes conductive sidewalls 208, a first terminal 218, a second terminal 219, a third terminal 220, and a dielectric region 207.

Although the vector inductor 200 is illustrated as including sixteen conductors, the teachings herein are applicable to vector inductors including more or fewer conductors.

The vector inductor 200 illustrates a configuration including a stack of conductors that are substantially U-shaped when viewed from above. Each of the U-shaped conductors includes a conductive base, a first conductive arm, and a second conductive arm. Additionally, the conductive sidewalls 208 electrically connect the conductive bases of the first to sixteenth conductors 202a-202p to one another along a first side 213a of the conductor stack. Furthermore, the conductive sidewalls 208 electrically connect the first to sixteenth conductors 202a-202p to one another along a second side 213b of the conductor stack associated with ends of the conductors' first conductive arms. Additionally, the conductive sidewalls 208 electrically connect the first to sixteenth conductors 202a-202p to one another along a third side 213c of the conductor stack associated with ends of the conductors' second conductive arms.

In one embodiment, the vector inductor 200 is implemented as a discrete component. For example, in certain configurations the vector inductor 200 comprises a discrete component that can be attached to a surface of a substrate using surface mount technology (SMT).

In another embodiment, the vector inductor 200 is implemented within a printed circuit board (PCB). In such a configuration, the first to sixteenth conductors 202a-202p can correspond to conductive layers of the PCB.

Figure 8B:
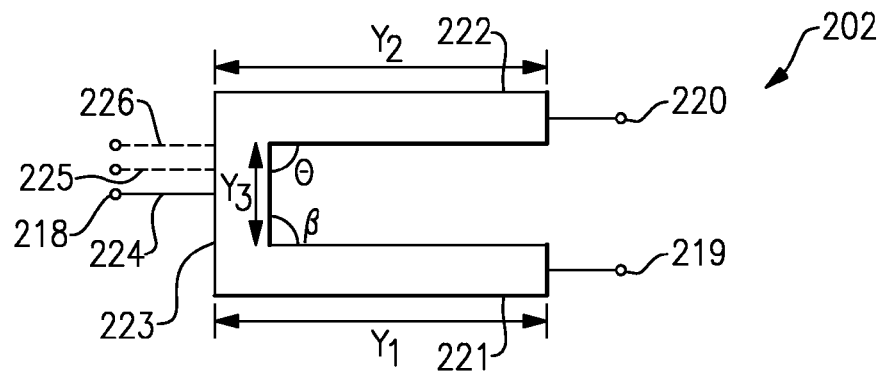
FIG. 8B is a plan view of a conductor of the vector inductor of FIG. 8A.

FIG. 8B is a plan view of a conductor 202 of the vector inductor 200 of FIG. 8A. The conductor 202 can represent a shape of any of the first to sixteenth conductors 202a-202p of FIG. 8A when viewed from above.

The conductor 202 includes a first conductive arm 221, a second conductive arm 222, and a conductive base 223. The first and second conductive arms 221, 222 extend out from the conductive base 223, which physically and electrically connects the first and second conductive arms 221, 222 to one another.

In certain configurations, the first terminal 218 can be connected to the conductive base 223, the second terminal 219 can be connected to an end of the first conductive arm 221, and the third terminal 220 can be connected to an end of the second conductive arm 222.

Figure 8C:
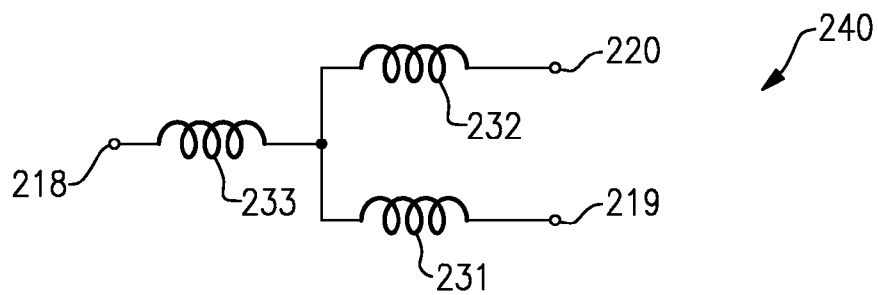
FIG. 8C is a circuit diagram of the vector inductor of FIG. 8A.

The vector inductor 200 of FIG. 8A can provide the equivalent circuit functionality of three inductor components. For example, FIG. 8C illustrates a circuit diagram 240 of the vector inductor 200 of FIG. 8A. As shown in FIG. 8C, the vector inductor 200 can have a circuit functionality represented by a first inductor 231, a second inductor 232, and a third inductor 233.

The first inductor 231 can be associated with a self-inductance of the first conductive arm 221, the second inductor 232 can be associated with a self-inductance of the second conductive arm 222, and the third inductor 233 can be associated with a mutual inductance between the first and second conductive arms 221, 222.

In certain configurations, the conductor 202 has conductive arm lengths selected to control an inductance of the first and second inductors 231, 232. For example, the self-inductance of an arm can be increased by implementing the arm to have a longer length. In certain configurations, the first and second conductive arms 221, 222 can have similar lengths such that the first and second conductive arms 221, 222 have about the same self-inductance. However, in other configurations, the conductive arms 221, 222 can have different lengths to provide different self-inductance values.

In one embodiment, a length $Y_1$ of the first conductive arm 221 is selected to be in the range of about 500 μm to about 2,500 μm, and a length $Y_2$ is in the range of about 500 μm to about 2,500 μm. However, other configurations are possible.

A separation between the first conductive arm 221 and the second conductive arm 222 can be used to control a mutual inductance between the first and second conductive arms 221, 222, thereby controlling an inductance of the third inductor 233 shown in FIG. 8C. In one embodiment, a separation $Y_3$ between the first and second conductive arms 221, 222 at the conductive base 223 is selected to be in the range of about 200 μm to about 1,000 μm.

The mutual inductance between the first and second conductive arms 221, 222 can also be controlled in part by selection of a dielectric material between the first and second conductive arms 221, 222. For example, as shown in FIG. 8A, in certain configurations, the first and second conductive arms 221, 222 can be separated by the dielectric region 207. In certain configurations, the dielectric region 207 can be implemented using a similar dielectric as the first to fifteenth dielectric regions 204a-204o. In one embodiment, the dielectric region 207 can comprise air.

In certain configurations, a tap point used to connect the first terminal 218 to the conductive base 223 can be used to control self-inductances of the first and second conductive arms 221, 222 and/or a mutual inductance between the first and second conductive arms 221, 222. Thus, the selection of the tap point can be used in part to control the inductances of the first, second, and third inductors 231-233 shown in FIG. 8C.

For example, FIG. 8B has been annotated to include a first electrical connection 224 from the first terminal 218 to a first tap point of the conductive base 223, a second electrical connection 225 from the first terminal 218 to a second tap point of the conductive base 223, and a third electrical connection 226 from the first terminal 218 to a third tap point of the conductive base 223. When connecting the first terminal 218 to the conductive base 223 using electrical connections associated with different tap points, a mutual inductance between the first and second conductive arms 221, 222 can change. Additionally, a self-inductance of the first and second conductive arms 221, 222 can also change with varying tap point, as an electrical length between the first terminal 218 and the second terminal 219 and an electrical length between the first terminal 218 and the third terminal 220 can change with tap point.

Accordingly, a selection of the tap point of the first terminal 218 to the conductive base 223 can be used to control inductance values of the first to third inductors 231-233. In one embodiment, a tap point of the first terminal 218 to the conductive base 223 is provided in a center of the conductive base 223. In another embodiment, a tap point of the first terminal 218 to the conductive base 223 is offset from the center of the conductive base 223.

Although the illustrated configuration includes conductive arms that are substantially parallel to one another, other configurations are possible. In one embodiment, an angle β between the first conductive arm 251 and the conductive base 223 is in the range of about 90° to about 120°, and an angle θ between the first conductive arm 251 and the conductive base 223 is in the range of about 90° to about 120°. In certain configurations, the angle β and the angle θ are the same. In other configurations, the angle β and the angle θ are different.

Figure 9:
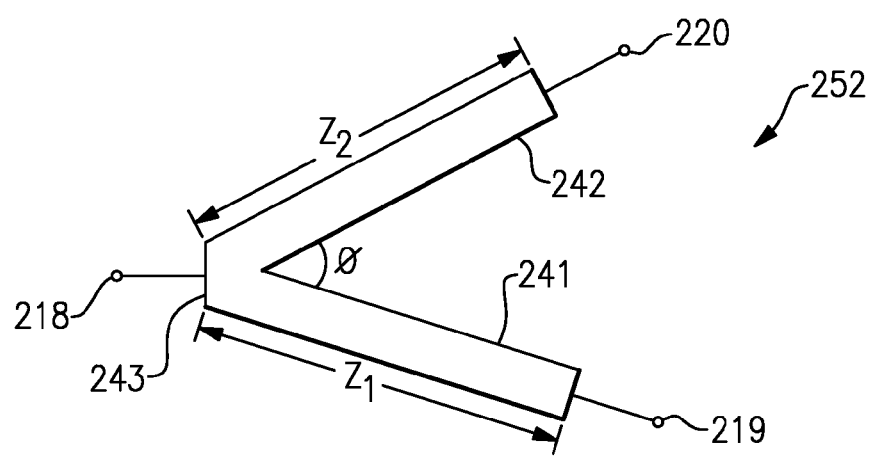
FIG. 9 is a plan view of a conductor of a vector inductor according to another embodiment.

FIG. 9 is a plan view of a conductor 252 of a vector inductor according to another embodiment.

The conductor 252 of FIG. 9 is similar to the conductor 202 of FIG. 8B, except that the conductor 252 is implemented in a V-shape rather than in a U-shape.

As shown in FIG. 9, the conductor 252 includes a first conductive arm 241, a second conductive arm 242, and a conductive base 243. The conductive base 243 is electrically connected to the first terminal 218. Additionally, the first conductive arm 241 extends from the conductive base 243, and includes an end electrically connected to the second terminal 219. Furthermore, the second conductive arm 242 extends from the conductive base 243, and includes an end electrically connected to the third terminal 220.

In one embodiment, the vector inductor 200 of FIG. 8A can be modified to include conductors shaped similarly to the conductor 252 of FIG. 9. Additionally, the vector inductor can be represented by a circuit diagram similar to the circuit diagram 240 of FIG. 8C, and the inductances of the first, second, and third inductors 231-233 shown in FIG. 8C can be controlled in part by geometrical characteristics of the conductor 252.

For example, a self-inductance of the first conductive arm 241, and thus an inductance of the first inductor 231 of FIG. 8C, can be based on a length $Z_1$ of the first conductive arm 241. Additionally, a self-inductance of the second conductive arm 242, and thus an inductance of the second inductor 232 of FIG. 8C, can be based on a length $Z_2$ of the second conductive arm 242. In one embodiment, the length $Z_1$ is selected to be in the range of about 500 µm to about 2,500 µm, and the length $Z_2$ is in the range of about 500 µm to about 2,500 µm. Although one example of arm lengths has been provided, other configurations are possible.

Furthermore, a mutual inductance between the first and second conductive arms 241, 242, and thus an inductance of the third inductor 233 of FIG. 8C, can be based on an angle between ϕ between the first and second conductive arms 241, 242. In one embodiment, the angle ϕ is selected to be in the range of about 30° to about 90°. Although one example range of arm separation angles has been provided, other configurations are possible.

Figure 10A:
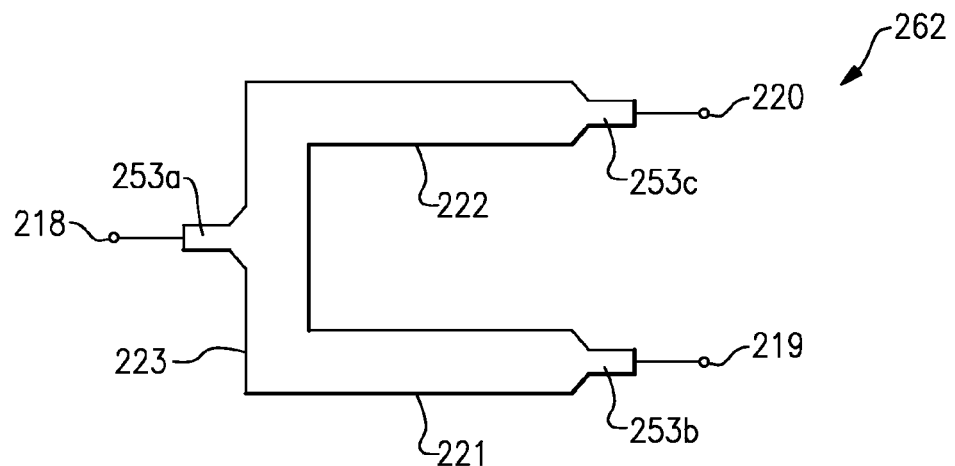
FIG. 10A is a plan view of a conductor of a vector inductor according to another embodiment.

FIG. 10A is a plan view of a conductor 262 of a vector inductor according to another embodiment. The conductor 262 of FIG. 10A is similar to the conductor 202 of FIG. 8B, except that the conductor 262 of FIG. 10A further includes a first stub 253a, a second stub 253b, and a third stub 253c. The stubs 253a-253c can aid in providing electrical termination between a vector inductor that includes the conductor 262 and other circuitry and/or components. Additional details of the conductor 262 can be similar to those described earlier.

Figure 10B:
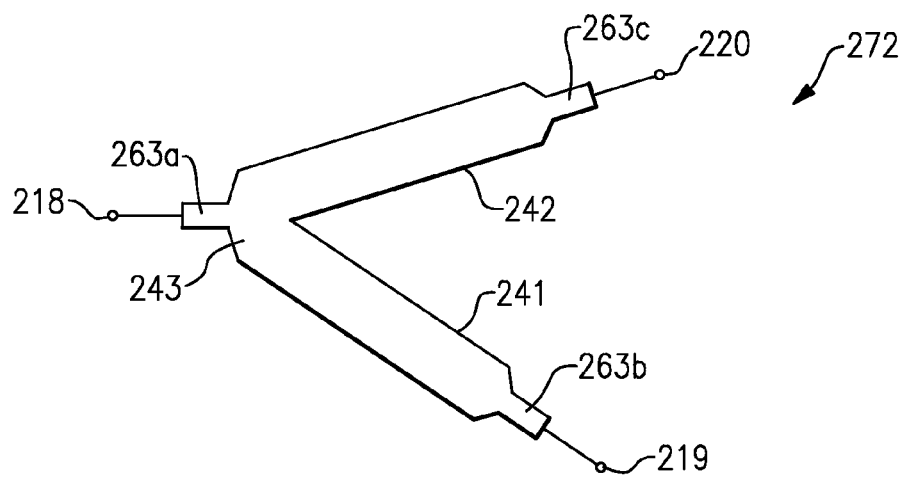
FIG. 10B is a plan view of a conductor of a vector inductor according to another embodiment.

FIG. 10B is a plan view of a conductor 272 of a vector inductor according to another embodiment. The conductor 272 of FIG. 10B is similar to the conductor 252 of FIG. 9, except that the conductor 272 of FIG. 10B further includes a first stub 263a, a second stub 263b, and a third stub 263c, which can aid in providing impedance termination. Additional details of the conductor 272 can be similar to those described earlier.

Figure 11:
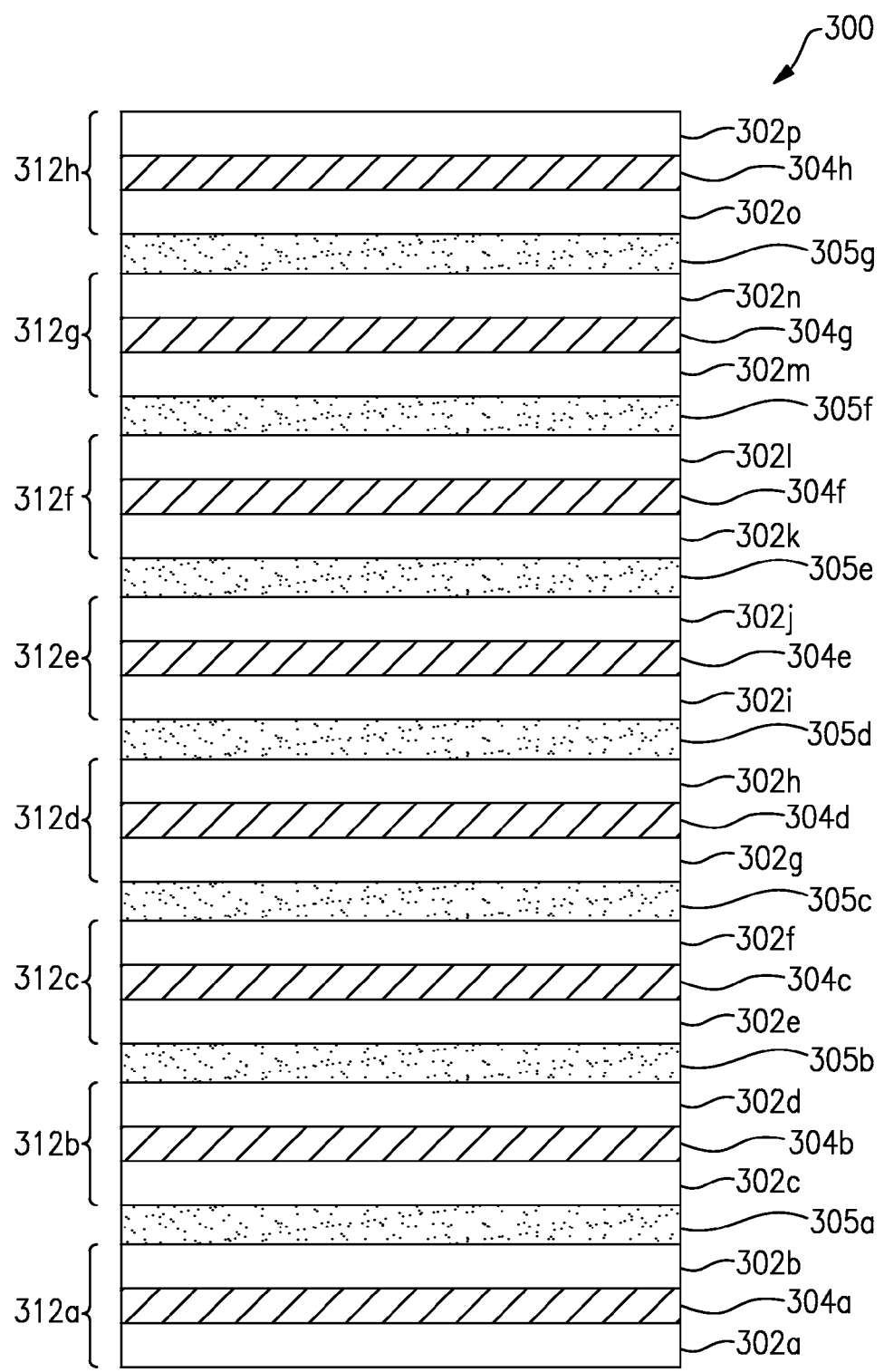
FIG. 11 is a cross section of a vector inductor according to another embodiment.

FIG. 11 is a cross section of a vector inductor 300 according to another embodiment. The vector inductor 300 includes a first subassembly 312a, a second subassembly 312b, a third subassembly 312c, a fourth subassembly 312d, a fifth subassembly 312e, a sixth subassembly 312f, a seventh subassembly 312g, and an eighth subassembly 312h. Although FIG. 11 illustrates a configuration including eight subassemblies, the teachings herein are applicable to configurations using more or fewer subassemblies.

The first subassembly 312a includes a first conductor 302a and a second conductor 302b separated by a first dielectric region 304a. Additionally, the second subassembly 312b includes a third conductor 302c and a fourth conductor 302d separated by a second dielectric region 304b. Furthermore, the third subassembly 312c includes a fifth conductor 302e and a sixth conductor 302f separated by a third dielectric region 304c. Additionally, the fourth subassembly 312d includes a seventh conductor 302g and an eighth conductor 302h separated by a fourth dielectric region 304d. Furthermore, the fifth subassembly 312e includes a ninth conductor 302i and a tenth conductor 302j separated by a fifth dielectric region 304e. Additionally, the sixth subassembly 312f includes an eleventh conductor 302k and a twelfth conductor 302l separated by a sixth dielectric region 304f. Furthermore, the seventh subassembly 312g includes a thirteenth conductor 302m and a fourteenth conductor 302n separated by a seventh dielectric region 304g. Additionally, the eighth subassembly 312h includes a fifteenth conductor 302o and a sixteenth conductor 302p separated by an eighth dielectric region 304h.

The first to eighth subassemblies 312a-312h are physically connected to one another using adhesive layers. For example, the first subassembly 312a is physically connected to the second subassembly 312b using a first adhesive layer 305a, the second subassembly 312b is physically connected to the third subassembly 312c using a second adhesive layer 305b, and the third subassembly 312c is physically connected to the fourth subassembly 312d using a third adhesive layer 305c. Additionally, the fourth subassembly 312d is physically connected to the fifth subassembly 312e using a fourth adhesive layer 305d, the fifth subassembly 312e is physically connected to the sixth subassembly 312f using a fifth adhesive layer 305e, the sixth subassembly 312f is physically connected to the seventh subassembly 312g using a sixth adhesive layer 305f, and the seventh subassembly 312g is physically connected to the eighth subassembly 312h using a seventh adhesive layer 305g.

The illustrated vector inductor 300 includes multiple subassemblies attached to one another by adhesive layers. In certain configurations, each individual subassemblies can be associated with a printed circuit board substrate, and multiple subassemblies can be physically connected to one another to form a vector inductor.

The illustrated configuration can be suitable, for example, in a configuration in which the vector inductor is used as a discrete component.

In one embodiment, the dielectric regions 304a-304h have a relative permittivity $\in_r$ that is in the range of about 2.7 to about 10, and the adhesive layers 305a-305g have a relative permittivity $\in_r$ that is in the range of about 2.7 to about 10. However, other configurations are possible.

The adhesive layers 305a-305g can comprise any suitable adhesive. In one embodiment, the adhesive layers 305a-305g can comprise at least one of FastRise27, Megtron-6, Bismaleimide Triazine (BT) MGC 972 LD, 83 NSLC, 832 NS or NX.

In one embodiment, the dielectric regions 304a-304h have a thickness $t_1$ as described earlier, the conductors 302a-302p have a thickness $t_2$ as described earlier, and the adhesive layers 305a-305g have a thickness in the range of about 8 µm to about 50 µm. Although one example of thickness dimensions have been provided, other configurations are possible.

In one embodiment, the vector inductor's conductors have about the same size and shape as one another. However, other configurations are possible, such as tapered configurations.

Although not illustrated in FIG. 11, the vector inductor 300 can be configured to include conductive sidewalls for electrically connecting the vector inductor's conductors in parallel with one another. Additionally, the vector inductor 300 can be adapted to include two or more electrical terminals for providing electrical connectivity to external components or circuitry.

Figure 12A:
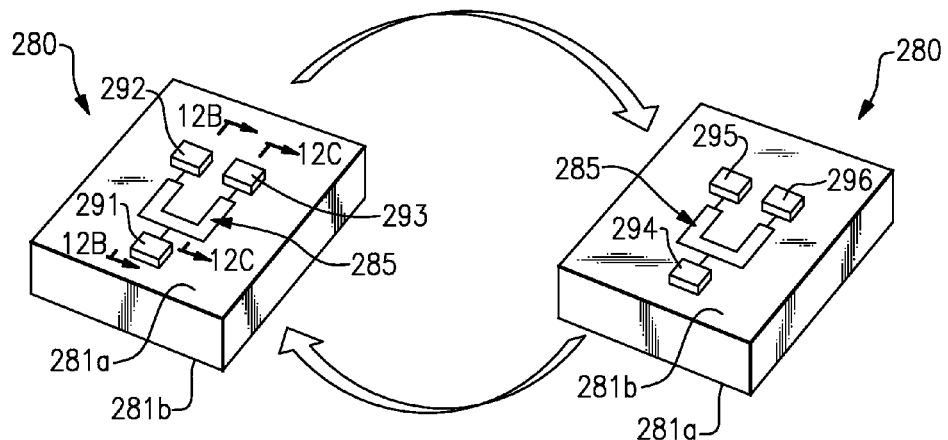
FIG. 12A is a schematic diagram of top and bottom perspective views of a PCB according to another embodiment.

FIG. 12A is a schematic diagram of top and bottom perspective views of a PCB 280 according to another embodiment. The PCB includes a U-shaped vector inductor 285 fabricated therein.

The PCB 280 includes a top surface 281a and a bottom surface 281b. In the illustrated configuration, a first component 291, a second component 292, and a third component 293 have been attached to the top surface 281a of the PCB 280. Additionally, the first component 291 is electrically connected to a first top surface terminal of the U-shaped vector inductor 285, the second component 292 is electrically connected to a second top surface terminal of the U-shaped vector inductor 285, and the third component 293 is electrically connected to a third top surface terminal of the U-shaped vector inductor 285. Furthermore, a fourth component 294, a fifth component 295, and a sixth component 296 have been attached to the bottom surface 281b of the PCB 280. Additionally, the fourth component 294 is electrically connected to a first bottom surface terminal of the U-shaped vector inductor 285, the fifth component 295 is electrically connected to a second bottom surface terminal of the U-shaped vector inductor 285, and the sixth component 296 is electrically connected to a third bottom surface terminal of the U-shaped vector inductor 285.

The first to sixth components 291-296 can be implemented in a variety of ways, including, for example, as SMCs, ICs, or a combination thereof. Furthermore, all or part of the first to sixth components 291-296 can be omitted in favor of connecting the U-shaped vector inductor 285 in other ways.

In one embodiment, the first to sixth components 291-296 comprise surface mount capacitors, and the U-shaped vector inductor 285 and the surface mount capacitors operate as a LC resonant circuit. In another embodiment, the first to sixth components 291-296 comprise ICs including one or more variable capacitors that have a controllable capacitance.

In one embodiment, the illustrated PCB 280 comprises a portion of a bridged-T filter. In another embodiment, the illustrated PCB 280 comprises a portion of the RF signal processing circuit 40 of FIG. 3B.

Although the PCB 280 is illustrated as including a U-shaped vector inductor, in one embodiment, the U-shaped vector inductor is omitted in favor of including a V-shaped vector inductor.

Figure 12B:
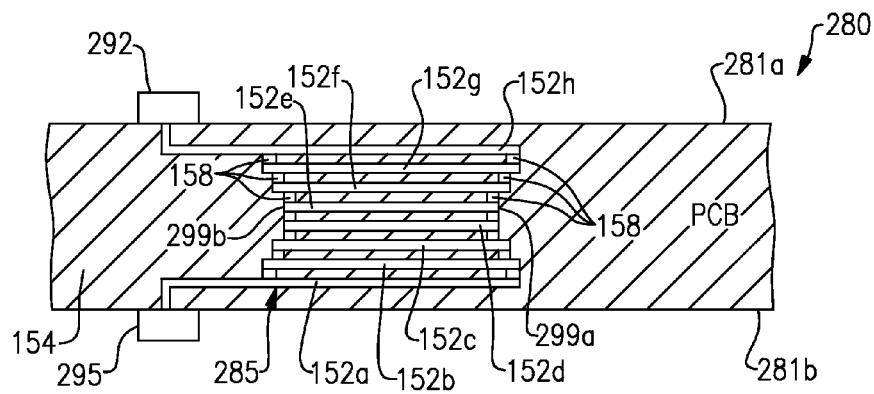
FIG. 12B is a cross section of the PCB of FIG. 12A taken along the lines 12B-12B according to one embodiment.
Figure 12C:
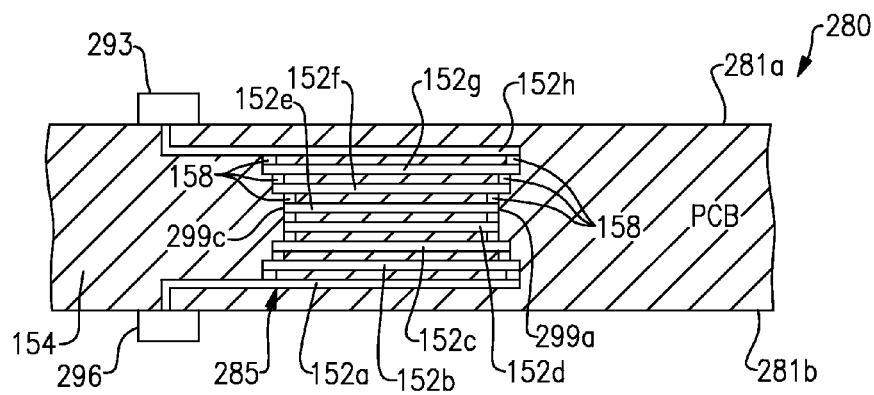
FIG. 12C is a cross section of the PCB of FIG. 12A taken along the lines 12C-12C according to one embodiment.

FIG. 12B is a cross section of the PCB 280 of FIG. 12A taken along the lines 12B-12B according to one embodiment. FIG. 12C is a cross section of the PCB 280 of FIG. 12A taken along the lines 12C-12C according to one embodiment.

In the cross sections shown in FIGS. 12B and 12C, the vector inductor 285 includes first to eighth conductors 152a-152h arranged in a stack and separated by dielectric 154. The PCB 280 further includes vias 158, which operate as conductive sidewalls of the vector inductor 285 to electrically connect adjacent conductors to one another along a first side 299a of the stack, along a second side 299b of the stack, and along a third side 299c of the stack.

Although the PCB 280 illustrates a vector inductor that includes eight conductors in the vector inductor's conductor stack, the teachings herein are applicable to configurations including more or fewer conductors in a stack.

As shown in FIGS. 12B and 12C, the first, second, and third sides 299a-299c of the conductor stack have been tapered to compensate for differences in mutual coupling between conductors. Although FIGS. 12B and 12C illustrated a configuration in which sides of the vector inductor 285 are tapered, the teachings herein are also applicable to configurations in which the vector inductor 285 includes a conductor stack with sides that are substantially straight. Additionally, the teachings herein are also applicable to a conductor stack includes a combination of tapered sides and substantially straight sides. For example, in one embodiment, the first side 299a of the vector inductor 285 is tapered, and the second and third sides 299b, 299c of the vector inductor 285 are substantially straight.

Figure 13:
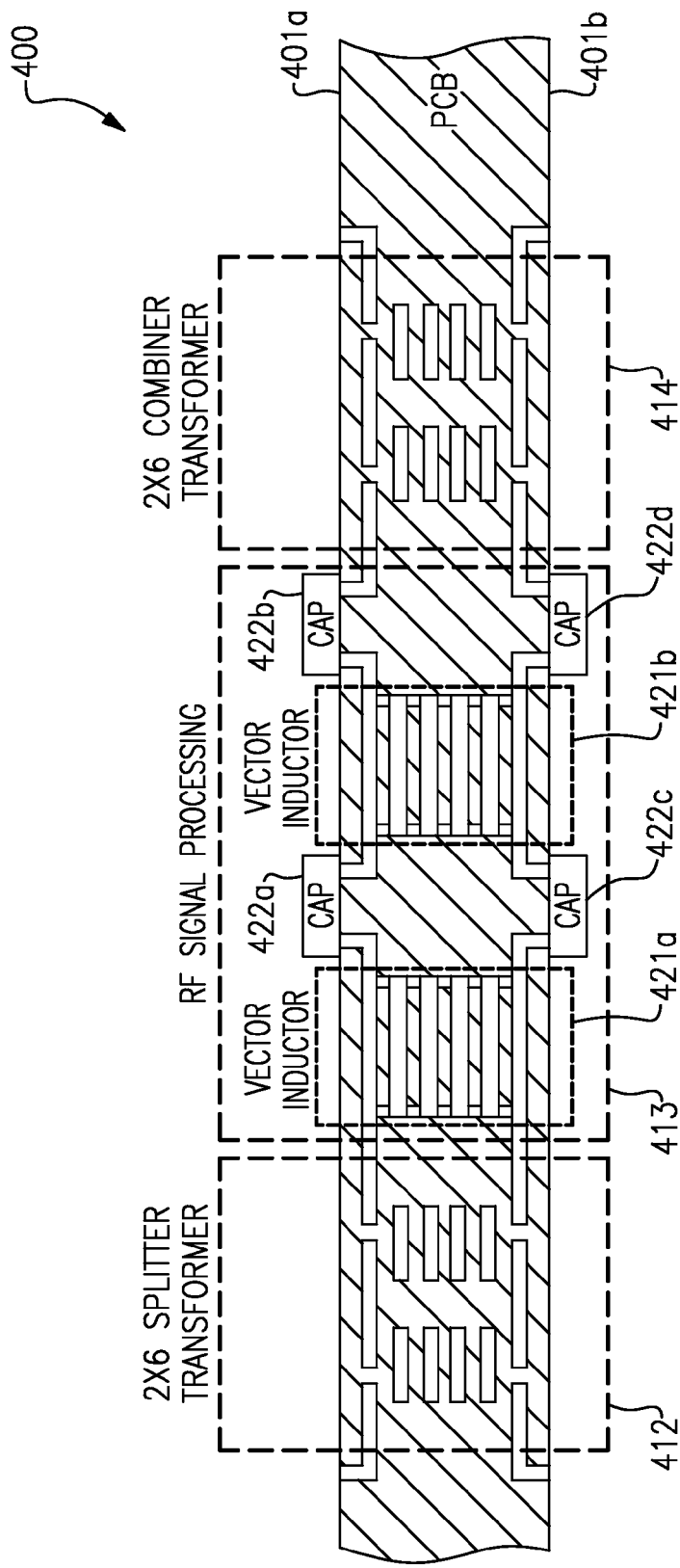
FIG. 13 is a cross section of a PCB according to another embodiment.

FIG. 13 is a cross section of a PCB 400 according to another embodiment. The PCB 400 has been implemented to include a splitter transformer 412, an RF signal processing circuit 413, and a combiner transformer 414. The PCB 400 includes a top surface 401a and a bottom surface 401b.

The illustrated portion of the RF signal processing circuit 413 includes a first vector inductor 421a, a second vector inductor 421b, a first capacitor component 422a, a second capacitor component 422b, a third capacitor component 422c, and a fourth capacitor component 422d. Although illustrated as including two vector inductors and four capacitor components, the RF signal processing circuit 413 can include additional vector inductors, capacitors and/or other circuitry that is not visible in the cross-section shown in FIG. 13. For example, the RF signal processing circuit 413 can include circuitry for processing each of N split signals outputted from the splitter transformer 412 to generate N processed signals for combiner transformer 414, where N is an integer.

As shown in FIG. 13, the first and second vector inductors 421a, 421b are implemented within the PCB 400 using stacks of six conductors. The first and second capacitor ICs 422a, 422b are attached to the top surface 401a of the PCB 400, and the third and fourth capacitor ICs 422c, 422d are attached to the bottom surface 401b of the PCB 400.

In the illustrated configuration, the splitter transformer 412 can be used to generate 6 split outputs, and can include 12 transformer windings. The splitter transformer 412 has been implemented in the PCB 400 in a folded configuration, in which a first 6 transformer windings have been implemented adjacent to a second 6 transformer windings of the splitter transformer 412. However, other configurations are possible. For example, the splitter transformer 412 can be implemented using three sections of 4 transformer windings, using four sections of 3 transformer windings, or using six sections of 2 transformer windings. Moreover, when the PCB 400 includes a sufficient number of conductive layers, the splitter transformer 412 can be implemented without folding.

In one embodiment, a splitter transformer includes P transformer windings, and the splitter transformer is implemented in a folded configuration including Q sections of P/Q transformer windings, where P is an integer greater than or equal to 4, Q is an integer greater than or equal to 2, and P/Q is an integer greater than or equal to 2. However, other configurations are possible, including, for example, configurations without folding.

In the illustrated configuration, the combiner transformer 414 can receive 6 processed signals as inputs, and can include 12 windings. In certain configurations, the combiner transformer 414 has a similar structure as the splitter transformer 412. For example, in certain implementations, a splitter transformer can be operated as a combiner transformer by reversing a direction of signal flow.

In one embodiment, the PCB 400 comprises alternating layers of conductor, such as copper, and a dielectric, such as FR-4 board. In another embodiment, the PCB 400 comprises a low temperature co-fired ceramic (LTCC) multi-layer PCB including alternating layers of conductor, such as copper and/or silver, and a ceramic dielectric, such as alumina. Additional details of the PCB 400 can be similar to those described earlier.

Figure 14A:
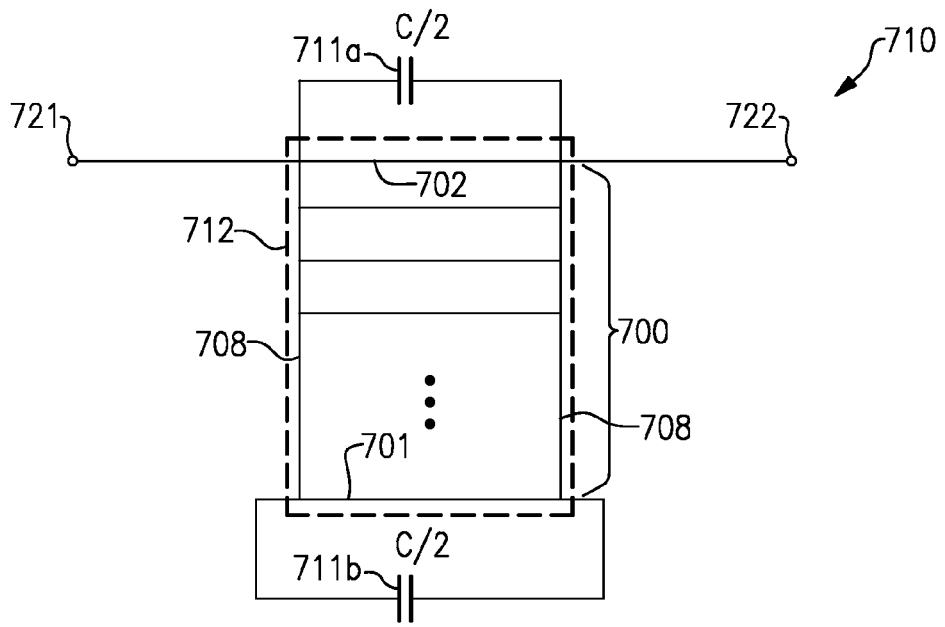
FIGS. 14A and 14B are schematic diagrams of resonant circuits according to various embodiments.
Figure 14B:
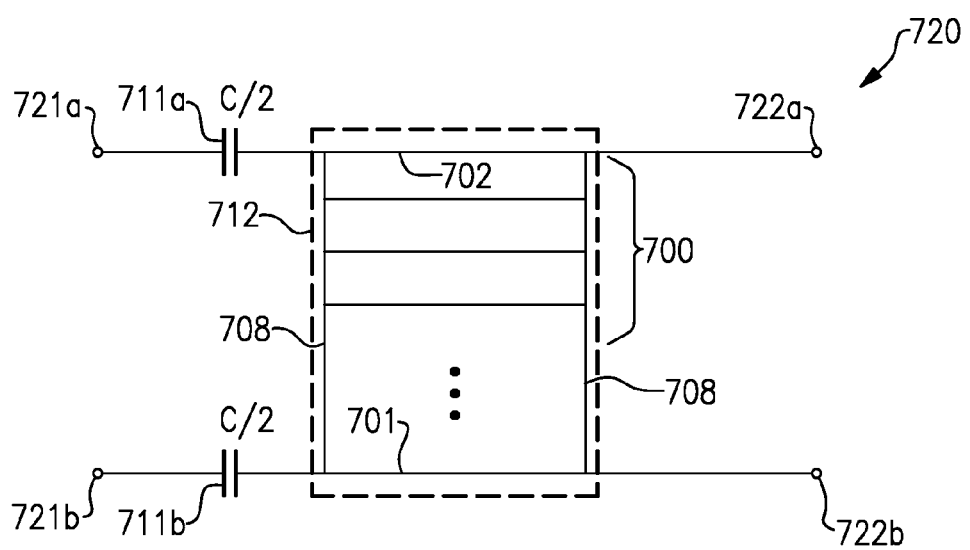

FIGS. 14A and 14B are schematic diagrams of resonant circuits according to various embodiments.

FIG. 14A is a schematic diagram of a parallel resonant LC circuit 710. The parallel resonant LC circuit 710 includes a first terminal 721, a second terminal 722, a first capacitor 711a, a second capacitor 711b, and a vector inductor 712. In the illustrated configuration, the first and second capacitors 711a, 711b have a capacitance value of C/2.

The vector inductor 712 includes a stack of conductors 700 electrically connected to one another at their ends using conductive sidewalls 708. The first capacitor 711a is electrically connected in parallel with an uppermost conductor 702 of the stack 700, and the second capacitor 711b is electrically connected in parallel with a bottommost conductor 701 of the stack 700. In certain implementations, the stack of conductors 700 includes conductors implemented in a substantially rectangular shape when viewed from above the stack.

FIG. 14B is a schematic diagram of a series resonant LC circuit 720. The series resonant LC circuit 720 includes a first top terminal 721a, a second top terminal 722a, a first bottom terminal 721b, a second bottom terminal 722b, the first capacitor 711a, the second capacitor 711b, and the vector inductor 712.

The first capacitor 711a is electrically connected in series between the first top terminal 721a and a first end of the uppermost conductor 702 of the stack 700. The second end of the uppermost conductor 702 of the stack 700 is electrically connected to the second top terminal 722a. The second capacitor 711b is electrically connected in series between the first bottom terminal 721b and a first end of the bottommost conductor 701 of the stack 700. The second end of the bottommost conductor 701 of the stack 700 is electrically connected to the second bottom terminal 722b.

The parallel resonant LC circuit 710 of FIG. 14A and the series resonant LC circuit 720 of FIG. 14B illustrate two examples of resonant circuits that can include a vector inductor. However, vector inductors can be included in other configurations of resonant circuits.

Figure 15:
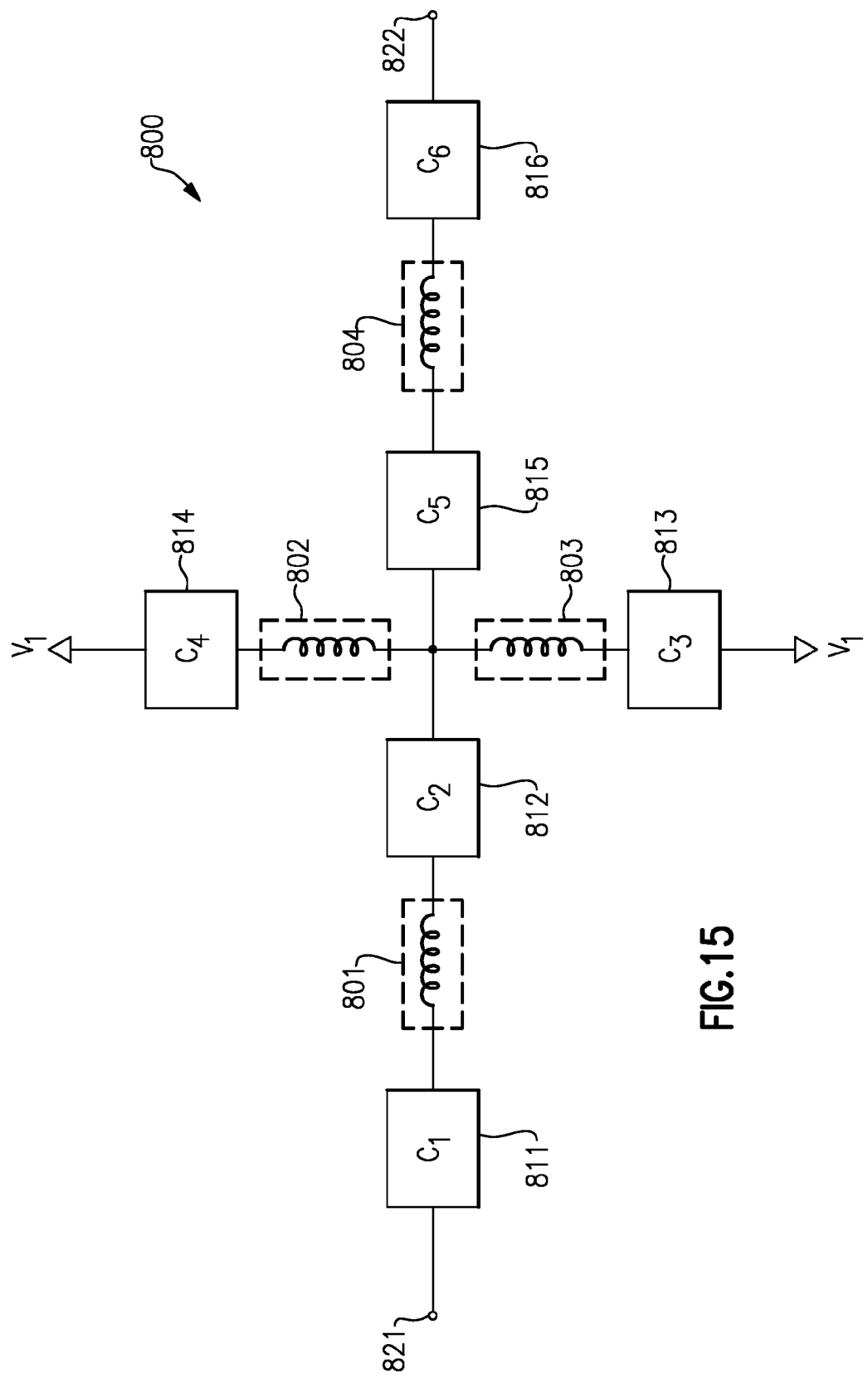
FIG. 15 is a schematic diagram of a filter according to one embodiment.

FIG. 15 is a schematic diagram of a filter 800 according to one embodiment. The filter 800 includes a filter input terminal 821 and a filter output terminal 822. The filter 800 includes a first capacitor 811, a second capacitor 812, a third capacitor 813, a fourth capacitor 814, a fifth capacitor 815, a sixth capacitor 816, a first vector inductor 801, a second vector inductor 802, a third vector inductor 803, and a fourth vector inductor 804.

The first capacitor 811 includes a first end electrically connected to the filter input terminal 821 and a second end electrically connected to a first terminal of the first vector inductor 801. The second capacitor 812 includes a first end electrically connected to a second terminal of the first vector inductor 801 and a second end electrically connected to a first end of the fifth capacitor 815, to a first terminal of the second vector inductor 802, and to a first terminal of the third vector inductor 803. The third capacitor 813 includes a first end electrically connected to a second terminal of the third vector inductor 803 and a second end electrically connected to the first voltage $V_1$. The fourth capacitor 814 includes a first end electrically connected to a second terminal of the second vector inductor 802 and a second end electrically connected to the first voltage $V_1$. The fifth capacitor 815 further includes a second end electrically connected to a first end of the fourth vector inductor 804. The sixth capacitor 816 includes a first end electrically connected to a second terminal of the fourth vector inductor 804 and a second end electrically connected to the filter output terminal 822.

The illustrated filter 800 is implemented as a Chebyshev filter. In certain configurations, the first to sixth capacitors 811-816 are implemented using variable capacitors disposed on one or more ICs, using discrete components, or a combination thereof. Although the filter 800 illustrates one example of a filter that can include vector inductors, vector inductors can be included in other configurations of filters and/or in other circuitry.

Applications

Some of the embodiments described above have provided examples in connection with programmable duplexers and programmable filters. However, the principles and advantages of the embodiments can be used in other suitable systems or apparatus.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus comprising:
    a vector inductor comprising:
        two or more terminals comprising a first terminal and a second terminal;
        a stack of conductors comprising three or more conductors arranged on different conductive layers, wherein each of the different conductive layers is separated by a dielectric,
        wherein the three or more conductors comprise a first conductor, a second conductor, and a third conductor, wherein the first conductor, the second conductor, and the third conductor each include a first end and a second end opposite the first end,
        wherein the first end of the first conductor, the first end of the second conductor, and the first end of the third conductor are electrically connected to one another along a first side of the stack,
        wherein the second end of the first conductor, the second end of the second conductor, and the second end of the third conductor are electrically connected to one another along a second side of the stack, and
        wherein the first end of the first conductor is electrically connected to the first terminal, and wherein the second end of the first conductor is electrically connected to the second terminal.

2. The apparatus of claim 1, wherein adjacent conductors in the stack are mutually coupled to one another with a coupling coefficient of at least 0.5.

3. The apparatus of claim 2, wherein the coupling coefficient is greater than 0.9.

4. The apparatus of claim 1, further comprising a printed circuit board (PCB), wherein the vector inductor is integrated into the PCB, wherein the different conductive layers comprises a plurality of conductive layers of the PCB.

5. The apparatus of claim 4,
    wherein the first conductor comprises a bottommost conductor of the stack,
    wherein the stack of conductors further comprises a topmost conductor of the stack, wherein the topmost conductor includes a first end and a second end opposite the first end,
    wherein the two or more terminals further comprises a third terminal electrically connected to the first end of the topmost conductor and a fourth terminal electrically connected to the second end of the topmost conductor.

6. The apparatus of claim 5, wherein the first and second sides of the stack are tapered to compensate for differences in mutual coupling between the three or more conductors of the stack.

7. The apparatus of claim 5, further comprising:
    a first capacitor component disposed on a first surface of the PCB and electrically connected to the first terminal of the vector inductor;
    a second capacitor component disposed on the first surface of the PCB and electrically connected to the second terminal of the vector inductor
    a third capacitor component disposed on a second surface of the PCB and electrically connected to the third terminal of the vector inductor, wherein the second surface of the PCB is opposite the first surface; and
    a fourth capacitor component disposed on the second surface of the PCB and electrically connected to the fourth terminal of the vector inductor.

8. The apparatus of claim 5, further comprising a splitter transformer integrated into the PCB, wherein the first terminal of the vector inductor is electrically connected to an output of the splitter transformer, wherein the splitter transformer comprises a plurality of windings implemented with the plurality of conductive layers of the PCB in a folded configuration, wherein a number of the plurality of windings is greater than a number of the plurality of conductive layers of the PCB.

9. The apparatus of claim 1, wherein the vector inductor comprises a surface mount component (SMC).

10. The apparatus of claim 1, wherein the first conductor, the second conductor, and the third conductor have the same shape and are adjacent to each other.

11. An apparatus comprising:
    a vector inductor comprising:
        a stack of conductors comprising three or more conductors arranged on different conductive layers, wherein each of the different conductive layers is separated by a dielectric,
        wherein the three or more conductors comprise a first conductor, a second conductor, and a third conductor, wherein the first conductor, the second conductor, and the third conductor each comprise a conductive base, a first conductive arm extending from the conductive base, and a second conductive arm extending from the conductive base,
        wherein the conductive base of the first conductor, the conductive base of the second conductor, and the conductive base of the third conductor are electrically connected to one another along a first side of the stack,
        wherein an end of the first conductive arm of the first conductor, an end of the first conductive arm of the second conductor, and an end of the first conductive arm of the third conductor are electrically connected to one another along a second side of the stack, and
        wherein an end of the second conductive arm of the first conductor, an end of the second conductive arm of the second conductor, and an end of the second conductive arm of the third conductor are electrically connected to one another along a third side of the stack.

12. The apparatus of claim 11, wherein adjacent conductors in the stack are mutually coupled to one another with a coupling coefficient greater than 0.9.

13. The apparatus of claim 11, wherein the three or more conductors have a substantially U-shape when viewed from above the stack.

14. The apparatus of claim 11, wherein the three or more conductors have a substantially V-shape when viewed from above the stack.

15. The apparatus of claim 11, wherein the first conductive arm of the first conductor and the second conductive arm of the first conductor have different lengths.

16. The apparatus of claim 11, wherein the first conductor, the second conductor, and the third conductor have the same shape and are adjacent to each other.

17. The apparatus of claim 11, further comprising:
three or more terminals comprising a first terminal, a second terminal, and a third terminal,
wherein the conductive base of the first conductor is electrically connected to the first terminal, wherein the end of the first conductive arm of the first conductor is electrically connected to the second terminal, and wherein the end of the second conductive arm of the first conductor is electrically connected to the third terminal.

18. The apparatus of claim 17, wherein an electrical connection between the first terminal and the conductive base of the first conductor is offset from a center of the conductive base of the first conductor.

19. The apparatus of claim 17, further comprising a printed circuit board (PCB), wherein the vector inductor is integrated into the PCB, wherein the different conductive layers comprises a plurality of conductive layers of the PCB.

20. The apparatus of claim 19,
wherein the first conductor comprises a bottommost conductor of the stack,
wherein the stack of conductors further comprises a topmost conductor of the stack, wherein the topmost conductor comprises a conductive base, a first conductive arm extending from the conductive base, and a second conductive arm extending from the conductive base,
wherein the three or more terminals further comprises a fourth terminal, a fifth terminal, and a sixth terminal, wherein the conductive base of the topmost conductor is electrically connected to the fourth terminal, wherein the end of the first conductive arm of the topmost conductor is electrically connected to the fifth terminal, and wherein the end of the second conductive arm of the topmost conductor is electrically connected to the sixth terminal.

21. The apparatus of claim 20, wherein at least one of the first side, the second side, or the third side of the stack is tapered to compensate for differences in mutual coupling between the three or more conductors of the stack.

22. The apparatus of claim 20, further comprising:
a first capacitor component disposed on a first surface of the PCB and electrically connected to the first terminal of the vector inductor;
a second capacitor component disposed on the first surface of the PCB and electrically connected to the second terminal of the vector inductor;
a third capacitor component disposed on the first surface of the PCB and electrically connected to the third terminal of the vector inductor;
a fourth capacitor component disposed on a second surface of the PCB and electrically connected to the fourth terminal of the vector inductor, wherein the second surface of the PCB is opposite the first surface;
a fifth capacitor component disposed on the second surface of the PCB and electrically connected to the fifth terminal of the vector inductor; and
a sixth capacitor component disposed on the second surface of the PCB and electrically connected to the sixth terminal of the vector inductor.

23. The apparatus of claim 19, further comprising a splitter transformer integrated into the PCB, wherein the first terminal of the vector inductor is electrically connected to an output of the splitter transformer, wherein the splitter transformer comprises a plurality of windings implemented with the plurality of conductive layers of the PCB in a folded configuration, wherein a number of the plurality of windings is greater than a number of the plurality of conductive layers of the PCB.

24. The apparatus of claim 11, wherein the vector inductor comprises a surface mount component (SMC).

25. An apparatus comprising:
a vector inductor comprising three or more inductive elements, wherein the three or more inductive elements comprise:
a first inductive element arranged on a first conductive layer;
a second inductive element arranged on a second conductive layer; and
a third inductive element arranged on a third conductive layer, wherein each of the first conductive layer, the second conductive layer, and the third conductive layer are separated by one or more dielectric layers, and
wherein the three or more inductive elements are electrically connected in parallel, wherein the three or more inductive elements are arranged such that an overall inductance of the vector inductor is not reduced by the parallel combination due to mutual coupling between the three or more inductive elements.

26. The apparatus of claim 25, wherein the first inductive element, the second inductive element, and the third inductive element have the same shape and are adjacent to each other.

* * * * *